(12) United States Patent
Aikawa et al.

(10) Patent No.: US 9,184,081 B2
(45) Date of Patent: *Nov. 10, 2015

(54) ELECTROSTATIC CHUCK

(71) Applicant: NGK INSULATORS, LTD., Nagoya (JP)

(72) Inventors: Kenichiro Aikawa, Handa (JP); Morimichi Watanabe, Nagoya (JP); Asumi Jindo, Okazaki (JP); Yuji Katsuda, Tsushima (JP); Yosuke Sato, Hashima-County (JP); Yoshinori Isoda, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 181 days.

This patent is subject to a terminal disclaimer.

(21) Appl. No.: 13/869,285

(22) Filed: Apr. 24, 2013

(65) Prior Publication Data

US 2013/0235507 A1 Sep. 12, 2013

Related U.S. Application Data

(63) Continuation of application No. PCT/JP2011/073771, filed on Oct. 11, 2011.

(30) Foreign Application Priority Data

Oct. 25, 2010 (JP) ................................. 2010-238999
Jun. 17, 2011 (JP) ................................. 2011-135313
Aug. 29, 2011 (WO) .................. PCT/JP2011/069491

(51) Int. Cl.
*H01L 21/683* (2006.01)
*H01T 23/00* (2006.01)
(Continued)

(52) U.S. Cl.
CPC ............ *H01L 21/6833* (2013.01); *C04B 35/58* (2013.01); *C04B 35/581* (2013.01);
(Continued)

(58) Field of Classification Search
USPC .......................................................... 361/234
See application file for complete search history.

(56) References Cited

U.S. PATENT DOCUMENTS 3,531,245 A 9/1970 Dietz
5,231,062 A 7/1993 Mathers et al.
(Continued)

FOREIGN PATENT DOCUMENTS

JP 62-028917 A1 2/1987
JP 04-304359 A1 10/1992
(Continued)

OTHER PUBLICATIONS

U.S. Appl. No. 13/863,729, filed Apr. 16, 2013, Kondo et al.
(Continued)

*Primary Examiner* — Dharti Patel
(74) *Attorney, Agent, or Firm* — Burr & Brown, PLLC

(57) ABSTRACT

Each of electrostatic chucks 1A to 1F includes a susceptor 11A having an adsorption face 11a of adsorbing a semiconductor, and an electrostatic chuck electrode 4 embedded in the susceptor. The susceptor includes a plate shaped main body 3 and a surface corrosion resistant layer 2 including the adsorption face 2. The surface corrosion resistant layer 2 is made of a ceramic material comprising magnesium, aluminum, oxygen and nitrogen as main components. The ceramic material comprises a main phase comprising MgO—AlN solid solution wherein aluminum nitride is dissolved into magnesium oxide.

17 Claims, 9 Drawing Sheets

(51) Int. Cl.
  *C04B 35/581* (2006.01)
  *C04B 35/58* (2006.01)
  *C04B 35/626* (2006.01)
  *C04B 35/645* (2006.01)
  *C23C 14/34* (2006.01)

(52) U.S. Cl.
  CPC ....... *C04B35/6261* (2013.01); *C04B 35/62655* (2013.01); *C04B 35/645* (2013.01); *C23C 14/3414* (2013.01); *C04B 2235/3206* (2013.01); *C04B 2235/3217* (2013.01); *C04B 2235/3222* (2013.01); *C04B 2235/3865* (2013.01); *C04B 2235/3869* (2013.01); *C04B 2235/5445* (2013.01); *C04B 2235/762* (2013.01); *C04B 2235/77* (2013.01); *C04B 2235/80* (2013.01); *C04B 2235/96* (2013.01); *C04B 2235/9669* (2013.01)

(56) References Cited

U.S. PATENT DOCUMENTS

| | | | |
|---|---|---|---|
| 5,314,675 | A | 5/1994 | Dubots et al. |
| 5,336,280 | A | 8/1994 | Dubots et al. |
| 5,457,075 | A | 10/1995 | Fukushima et al. |
| 5,721,062 | A | 2/1998 | Kobayashi |
| 6,071,465 | A | 6/2000 | Kobayashi |
| 6,239,402 | B1 * | 5/2001 | Araki et al. ............ 219/121.4 |
| 6,447,937 | B1 | 9/2002 | Murakawa et al. |
| 7,122,490 | B2 * | 10/2006 | Kobayashi et al. ......... 501/98.4 |
| 7,255,934 | B2 | 8/2007 | Hatono et al. |
| 7,473,661 | B2 * | 1/2009 | Lee et al. ............... 501/98.5 |
| 8,541,328 | B2 * | 9/2013 | Watanabe et al. ......... 501/98.5 |
| 2001/0055190 | A1 | 12/2001 | Saito et al. |
| 2003/0049499 | A1 | 3/2003 | Murakawa et al. |
| 2003/0128483 | A1 | 7/2003 | Kamijo |
| 2003/0183615 | A1 | 10/2003 | Yamaguchi et al. |
| 2005/0173412 | A1 | 8/2005 | Kondou et al. |
| 2006/0240972 | A1 | 10/2006 | Lee et al. |
| 2007/0258281 | A1 | 11/2007 | Ito et al. |
| 2008/0124454 | A1 | 5/2008 | Djayaprawira et al. |
| 2010/0104892 | A1 | 4/2010 | Kobayashi et al. |

FOREIGN PATENT DOCUMENTS

| | | |
|---|---|---|
| JP | 05-319937 A1 | 12/1993 |
| JP | 06-037207 A1 | 2/1994 |
| JP | 08-073280 A1 | 3/1996 |
| JP | 09-219369 A1 | 8/1997 |
| JP | 2000-044345 A1 | 2/2000 |
| JP | 2001-308167 A1 | 11/2001 |
| JP | 2003-288975 A1 | 10/2003 |
| JP | 3559426 B2 | 9/2004 |
| JP | 2005-203456 A1 | 7/2005 |
| JP | 2006-080116 A1 | 3/2006 |
| JP | 2007-084367 A1 | 4/2007 |
| JP | 2007-300079 A1 | 11/2007 |
| JP | 2008-115065 A1 | 5/2008 |
| JP | 2009-292688 A1 | 12/2009 |

OTHER PUBLICATIONS

U.S. Appl. No. 13/863,803, filed Apr. 16, 2013, Kondo et al.
U.S. Appl. No. 13/864,467, filed Apr. 17, 2013, Aikawa et al.
U.S. Appl. No. 13/864,559, filed Apr. 17, 2013, Kondo et al.
U.S. Appl. No. 13/478,508, filed May 23, 2012, Watanabe et al.
U.S. Appl. No. 13/478,591, filed May 23, 2012, Watanabe et al.
Arielle Granon, et al., "Aluminum Magnesium Oxynitride: A New Transparent Spinel Ceramic," *Journal of the European Ceramic Society*, vol. 15, 1995, pp. 249-254.
J. Weiss, et al., "*The System Al—Mg—O—N*," Communications of the American Ceramic Society, vol. 65, May 1982, C68-C69.
Guotian Ye, et al., "*Synthesis and Oxidation Behavior of MgAlON Prepared from Different Starting Materials*," J. Am. Ceram. Soc., vol. 93, No. 2, 2010, pp. 322-325.
International Search Report and Written Opinion dated Nov. 15, 2011.

* cited by examiner

Fig. 9
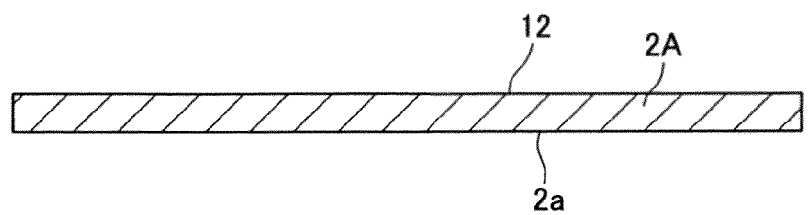
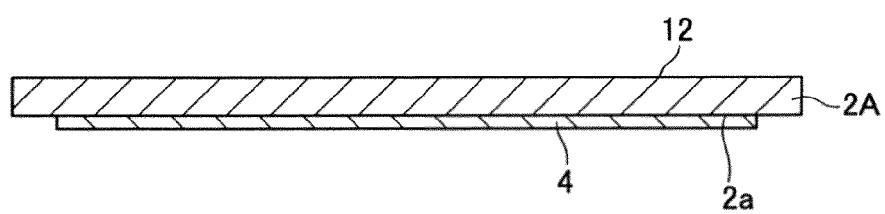
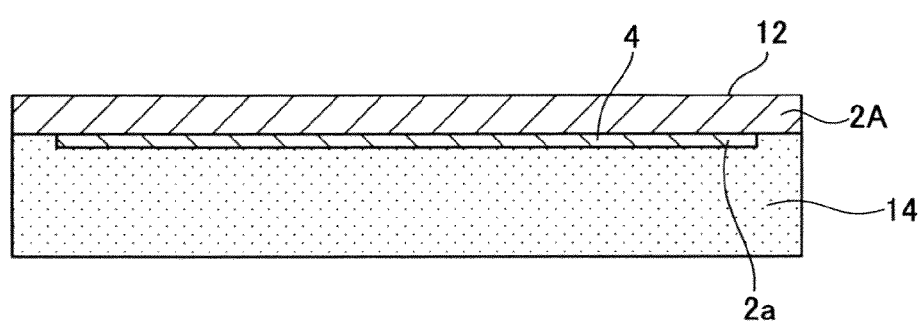
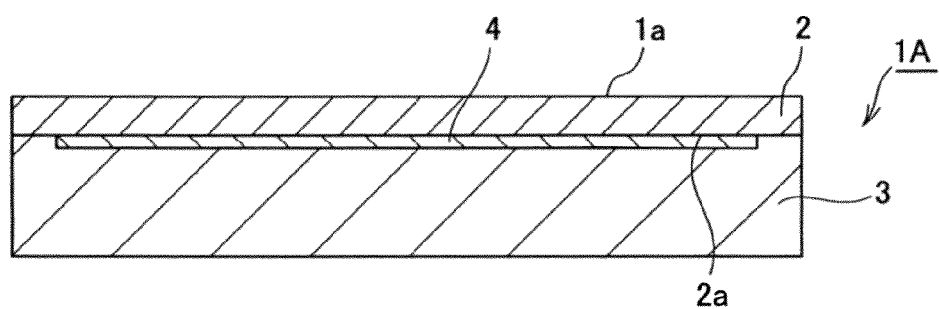

ELECTROSTATIC CHUCK

BACKGROUND OF THE INVENTION

1. Field of the Invention

The present invention relates to an electrostatic chuck device of adsorbing and processing a semiconductor.

2. Description of Related Art

In a system of producing semiconductors used for dry process or plasma coating in semiconductor production, it has been used halogen-based plasma such as F, Cl or the like having high reactivity for etching or cleaning. It is thus required, for a member equipped to such semiconductor production system, high corrosion resistance, so that it has been generally used a member of an anti-corrosive metal such as aluminum with alumite treatment, HASTELLOY or the like or a ceramic material. Especially, it is necessary high corrosion resistance and low particle generation properties for an electrostatic chuck or heater member supporting and fixing an Si wafer, so that it has been used a high corrosion resistant ceramic member such as aluminum nitride, alumina, sapphire or the like. As these materials are used for a long time, they are gradually corroded to induce particle generation, so that it has been demanded a material whose corrosion resistance is further improved. For attending such demands, it has been studied to use, as the material, magnesia, spinel ($MgAl_2O_4$) or a composite material thereof whose corrosion resistance is higher than that of alumina (For example, Patent document 1; U.S. Pat. No. 3,559,426B).

In a production procedure of a semiconductor device, a semiconductor is adsorbed and held on a wafer mounting face of an electrostatic chuck, and the adsorbed and held semiconductor wafer is subjected to various treatments such as heating or etching treatment. According to an electrostatic chuck, an electrostatic electrode is embedded within a disk shaped ceramic substrate having a wafer mounting face for generating an electrostatic force on the wafer mounting face. A heater electrode (referred to as resistance heating member) is optionally embedded therein for heating the wafer mounting face. As to the ceramic substrate, it has been proposed those made of alumina sintered body and aluminum nitride sintered body, as well as those made of materials with high corrosion resistance against fluorine such as yttria sintered body and magnesia sintered body, for example, considering that the electrostatic chuck is used under condition of contacting a gas containing fluorine. For example, according to Patent Document 2 (Japanese Patent Publication No. 2001-308167A), it is proposed an electrostatic chuck of Johnson-Lahbeck type using a ceramics containing magnesia (MgO) as its main phase. Besides, Patent Document 3 (Japanese Patent Publication No. 2009-292688A), and Patent document 4 (Japanese Patent Publication No. 2006-080116A) are related to magnesium oxide.

SUMMARY OF THE INVENTION

According to conventional semiconductor production processes, for preventing contamination of a wafer, it has been used a strongly corrosive gas such as halogen based gas for cleaning a system. Further, it is demanded temperature uniformity on wafer for forming a film uniformly on the wafer.

As a member for supporting and further heating an Si wafer in a system for producing semiconductors, it has been widely used a ceramic heater with a ceramic electrostatic chuck made of alumina as described above as an existing art. It is thereby possible to obtain good temperature uniformity on wafer in the initial stage of use. However, AlN is corroded due to cleaning by a corrosive gas so that the shape and roughness of the heater surface is changed. The temperature distribution is thereby changed as the use time passes so that the temperature uniformity cannot be maintained and the adsorption force is deteriorated, which is problematic.

An object of the present invention is, in an electrostatic chuck used for semiconductor processing, to maintain good temperature uniformity for a long period of time and to prevent deterioration of adsorption force, when it is used under atmosphere of a halogen based corrosive gas or its plasma.

The present invention provides an electrostatic chuck comprising a susceptor having an adsorption face adsorbing a semiconductor and an electrostatic chuck electrode embedded within the susceptor. The susceptor includes a plate shaped main body and a surface corrosion resistant layer including the adsorption face. The surface corrosion resistance layer is composed of a ceramic material comprising main components comprising magnesium, aluminum, oxygen and nitrogen, and the ceramic material comprises, as a main phase, a crystal phase comprising MgO—AlN solid solution wherein aluminum nitride is dissolved into magnesium oxide.

The ceramic material of the present invention includes the magnesium-aluminum oxynitride phase as the main phase, and more superior in corrosion resistance against a strongly corrosive gas such as a halogen based gas or the like compared with alumina, for example. By forming the surface corrosion resistant layer of the susceptor with this ceramic material, it is resistive against the change of the surface state due to the corrosion even in the case that it is used under corrosive condition for a long time. It is thereby possible to obtain good temperature uniformity on wafer and adsorption force for a long time.

Further, the plate shaped main body may be formed with a material with a high thermal conductivity and different from the ceramic material, so that it is possible to facilitate thermal conduction in planar directions on the susceptor to further improve the temperature uniformity on wafer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 7(d) is a cross sectional view schematically showing 1G in which a cooling plate is bonded to a back face of an electrostatic chuck according to an embodiment of the present invention.

FIGS. 9(a), (b), (c) and (d) are diagrams illustrating a preferred process of producing an electrostatic chuck.

DETAILED DESCRIPTION OF THE INVENTION

Figure 1:
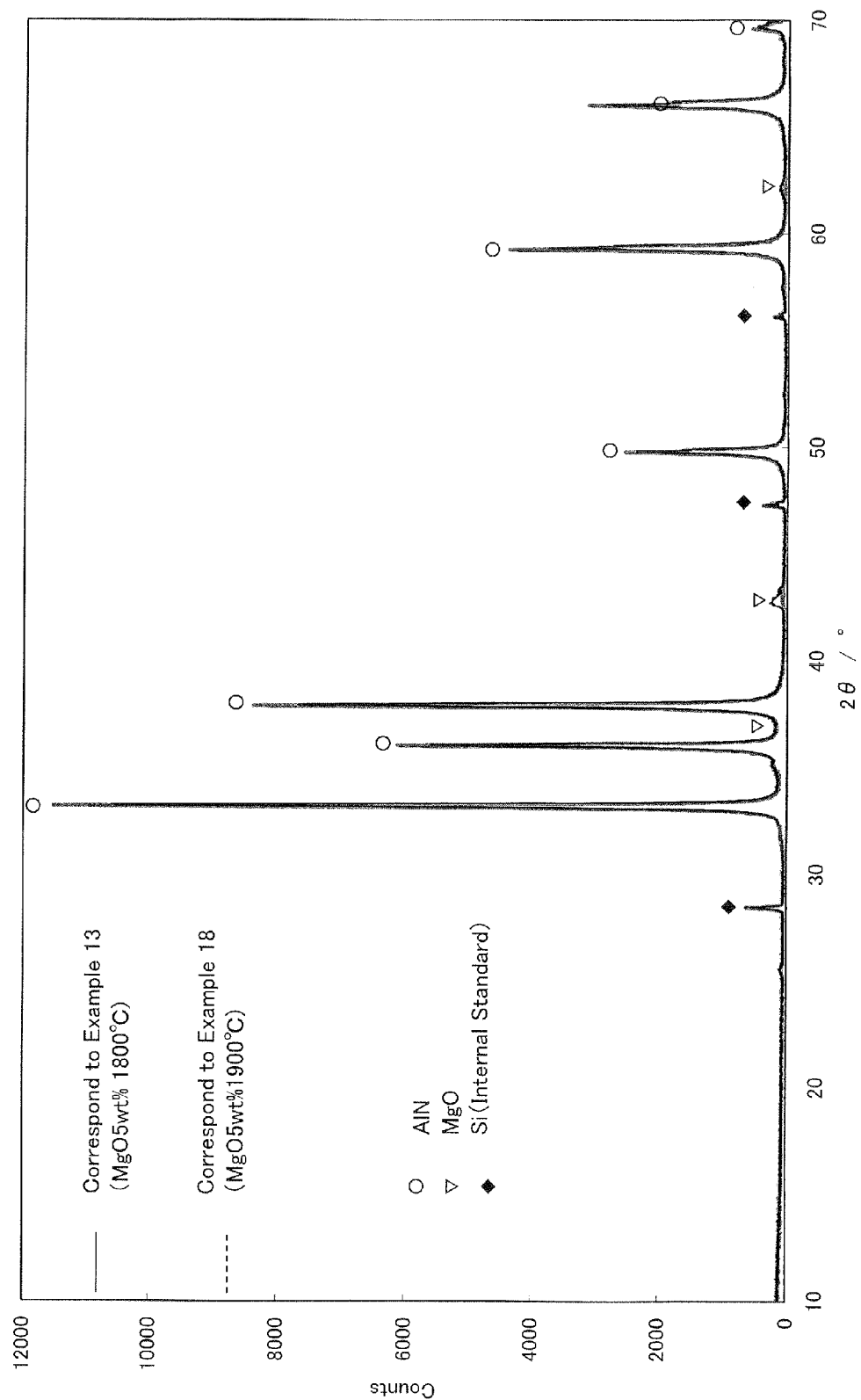
FIG. 1 is an XRD analytical chart obtained in Experiment 1.

The novel ceramic material used in the present invention will be described first, and details of the heating apparatus will be described later.
(Ceramic Material)

The inventive ceramic material is a ceramic material including main components comprising magnesium, aluminum, oxygen and nitrogen, and the ceramic material includes MgO—AlN solid solution as the main phase in which aluminum and nitrogen components are dissolved into magnesium oxide. According to the present invention, MgO—AlN solid solution means a material wherein aluminum and nitrogen components are dissolved into crystal lattice of magnesium oxide.

The ceramic material of the present invention has corrosion resistance comparable with that of magnesium oxide and humidity resistance and water resistance superior than those of magnesium oxide. Therefore, a member for use in a system for producing a semiconductor made of this ceramic material can endure halogen based plasma such as F, Cl or the like used in a semiconductor production process for a long time, so that it is possible to reduce an amount of particles generated from the member. Moreover, since its humidity resistance and water resistance are superior, it is characterized in that it is more resistive against denaturation and against wet processing than conventional magnesium oxide.

Further, the ceramic material of the present invention maintains crystal structure of magnesium oxide and has an electrical resistance lower than that of magnesium oxide. The reason is considered that aluminum and nitrogen are dissolved into magnesium oxide crystal to increase carriers in magnesium oxide.

The inventive ceramic material is a ceramic material including main components comprising magnesium, aluminum, oxygen and nitrogen, and the ceramic material includes MgO—AlN solid solution as the main phase in which aluminum and nitrogen components are dissolved into magnesium oxide. It is considered that the MgO—AlN solid solution has corrosion resistance comparable with that of magnesium oxide and humidity resistance and water resistance superior than those of magnesium oxide. It is thus considered that the ceramic material containing the MgO—AlN solid solution as its main phase also exhibits superior corrosion, humidity and water resistances. Besides, according to the ceramic material of the present invention, by adding aluminum nitride and aluminum oxide to magnesium oxide, it is possible to considerably increase contents of aluminum and nitrogen components dissolved therein. Therefore, according to the MgO—AlN solid solution, the content of aluminum may be higher than that of nitrogen in the solid solution.

It is preferred that the XRD peaks of (111), (200) and (220) faces of the MgO—AlN solid solution taken by using CuKα ray may be observed in ranges of 2θ=36.9 to 39°, 42.9 to 44.8° and 62.3 to 65.2°, respectively, which are between peaks of cubic crystal of magnesium oxide and cubic crystal of aluminum nitride, respectively. Alternatively, It is preferred that the XRD peaks of (200) and (220) faces of the MgO—AlN solid solution taken by using CuKα ray may be observed in ranges of 2θ=42.9 to 44.8° and 62.3 to 66.2°, respectively, which are between peaks of cubic crystal of magnesium oxide and cubic crystal of aluminum nitride, respectively, and that XRD peak of (111) face may be observed in a range of 2θ=36.9 to 39°, which is between peaks of cubic crystal of magnesium oxide and cubic crystal of aluminum nitride. Since it may be difficult to distinguish the peak of (111) face from the peaks corresponding with the other crystalline phases, only the XRD peaks of (200) face and (220) face may be observed in the above ranges. Similarly, it may be difficult to distinguish the peak of (200) face or the peak of (220) face from the peaks corresponding with the other crystalline phases.

As contents in the solid solution of aluminum and nitrogen components are larger, the humidity resistance and water resistance are improved. As an increase of the contents in the solid solution, the XRD peak of magnesium oxide is shifted toward the side of higher angle. It is thus more preferred that the XRD peaks of (200) and (220) faces of the MgO—AlN solid solution are observed in ranges of 2θ=42.92° or higher and 62.33° or higher, respectively, for further improving the humidity resistance. Further, it is more preferred that the XRD peaks of (200) and (220) faces of the MgO—AlN solid solution are observed in ranges of 2θ=42.95° or higher and 62.35° or higher, respectively, for further improving the humidity resistance and water resistance. Further, it is more preferred that the XRD peaks of (200) and (220) faces of the MgO—AlN solid solution are observed in ranges of 2θ=43.04° or higher and 62.50 or higher, respectively, for further improving the humidity resistance and water resistance. Further, it is more preferred that the XRD peaks at (200) and (220) faces of the MgO—AlN solid solution are observed in ranges of 2θ=48.17° or higher and 62.72° or higher, respectively, for still further improving the humidity resistance as well as water resistance. Further, it is found that the water resistance is improved as an integrated value of the MgO—AlN solid solution is smaller. That is, the integration width of the XRD peak of (200) face of the MgO—AlN solid solution may preferably be 0.50° or lower and more preferably be 0.35° or lower for improving the water resistance.

In the inventive ceramic material, the content of AlN crystal phase may preferably be lower and more preferably AlN crystal phase is not contained, because the corrosion resistance tends to be deteriorated in the case that AlN crystal phase is contained as the sub phase.

The inventive ceramic material may include magnesium-aluminum oxynitride phase exhibiting an XRD peak at least in 2θ=47 to 49° taken by using CuKα ray as a sub phase. As the magnesium-aluminum ozynitride has high corrosion resistance, it is not problematic if it is contained as a sub phase. As the content of the magnesium-aluminum oxynitride phase is larger, the mechanical strength can be further improved, so as to effectively affect the improvement of the strength and fracture toughness in particular. However, since its corrosion resistance is lower than that of the MgO—AlN solid solution, the content is limited on the viewpoint of corrosion resistance.

A/B may preferably be 0.03 or higher, provided that "A" is assigned to an XRD peak intensity of 2θ=47 to 49° of the magnesium-aluminum oxynitride phase, and that "B" is assigned to the peak intensity of the XRD peak of 2θ=62.3 to 65.2° of (220) face of the MgO—AlN solid solution. By this, the mechanical properties can be further improved. A/B may preferably be 0.14 or lower on the viewpoint of corrosion resistance. According to the ceramic material of the present invention, a molar ratio of magnesium/aluminum in powder mixture may preferably be 0.5 or higher.

An open porosity of the inventive ceramic material may preferably be 5% or lower. Here, the open porosity means a value measured by Archimedean method using pure water as a medium. In the case that the open porosity exceeds 5%, there would be a risk that the strength is lowered or the material itself would become susceptible to removal of grains and the resultant particle generation, and particle components tend to be stored in the pores during the processing of the material, which is not preferred. Further, it is preferred that the open porosity is nearer to zero as possible. The lower limit of it is not particularly defined.

Further, the ceramic material of the present invention may contain a small amount of heterogeneous phase. In the case of the ceramic material containing the MgO—AlN phase as the main phase, the value of (a+c+d)/(a+b+c+d) may preferably be 0.1 or smaller, provided that "a" is assigned to an area of the XRD peak of 2θ=47 to 49° of the magnesium-aluminum oxynitride phase, that "b" is assigned to an area of the XRD peak of 2θ=62.3 to 65.2° of (220) face of the MgO—AlN solid solution, that "c" is assigned to an area of the XRD peak of 2θ=around 45.0° of (400) face of spinel ($MgAl_2O_4$), and that "d" is assigned to an area of the XRD peak of 2θ=around 36.0° of (002) face of aluminum nitride (AlN). As the value of (a+c+d)/(a+b+c+d) is smaller, the ratio of the MgO—AlN solid solution in the ceramic material is large, and a total amount of the magnesium-aluminum oxynitride phase, spinel ($MgAl_2O_4$) and aluminum nitride (AlN), which may possibly constitute heterogeneous phases, is smaller. Such ceramic material containing a small amount of the heterogeneous phase, such as the ceramic material with a value of (a+c+d)/(a+b+c+d) of 0.1 or smaller, may preferably be used for a material of a sputtering target. In the case that the material of a sputtering target contains the heterogeneous phase, there is a possibility that sputtering rates are different from each other in the main and heterogeneous phases. When an amount of the heterogeneous phase is small, it is possible to further reduce deterioration of uniformity of the thus formed film and the generation of particles from the sputtering target member. Further, the lattice constant of magnesium oxide is changed by dissolving aluminum and nitrogen therein, it is possible to adjust the lattice constant depending on the amount of dissolution, so that it is possible to adjust the matching of lattice with that of a material on which the film is formed.

(Production of Ceramic Material)

The inventive ceramic material can be produced by molding powdery mixture of magnesium oxide, alumina and aluminum nitride and the subsequent sintering. As mixture of powdery raw materials, 49 mass percent or more of magnesium oxide, aluminum nitride and alumina (aluminum oxide) are preferably contained. On the viewpoint of corrosion resistance, in a composition of powder mixture, it is preferably mixed 70 mass percent or more and 99 mass percent or less of magnesium oxide, 0.5 mass percent and more and 25 mass percent or less of aluminum nitride and 0.5 mass percent or more and 25 mass percent or less of aluminum oxide, and it is more preferably mixed 70 mass percent or more and 90 mass percent or less of magnesium oxide, 5 mass percent and more and 25 mass percent or less of aluminum nitride and 5 mass percent or more and 25 mass percent or less of aluminum oxide. Further, on the viewpoint of realizing mechanical characteristics and corrosion resistance at the same time, in a composition of powder mixture, it is preferably mixed 49 mass percent or more and 99 mass percent or less of magnesium oxide, 0.5 mass percent and more and 25 mass percent or less of aluminum nitride and 0.5 mass percent or more and 30 mass percent or less of aluminum oxide, and it is more preferably mixed 50 mass percent or more and 75 mass percent or less of magnesium oxide, 5 mass percent and more and 20 mass percent or less of aluminum nitride and 15 mass percent or more and 30 mass percent or less of aluminum oxide.

The sintering temperature may preferably be 1650° C. or higher and more preferably be 1700° C. or higher. In the case that the sintering temperature is lower than 1650° C., it would be a risk that the targeted MgO—AlN solid solution would not be generated, which is not preferred. Further, in the case that the sintering temperature is lower than 1700° C., it would be a risk that AlN would be contained as the sub phase, and the sintering may preferably performed at a temperature of 1700° C. or higher for obtaining high corrosion resistance. Besides, although the upper limit of the sintering temperature is not particularly limited, it may be 1850° C., for example.

Further, hot press sintering may be preferably applied for the sintering, and a pressure during the hot press sintering may preferably be set in a range of 50 to 300 kgf/cm². Atmosphere during the sintering may preferably be that which does not affect the sintering of the oxide raw materials, and may preferably be an inert atmosphere such as nitrogen, argon, helium atmosphere or the like. The pressure for the molding is not particularly limited and may be adjusted at any pressure as far as it is possible to maintain the shape.

(Electrostatic Chuck)

Figure 6:
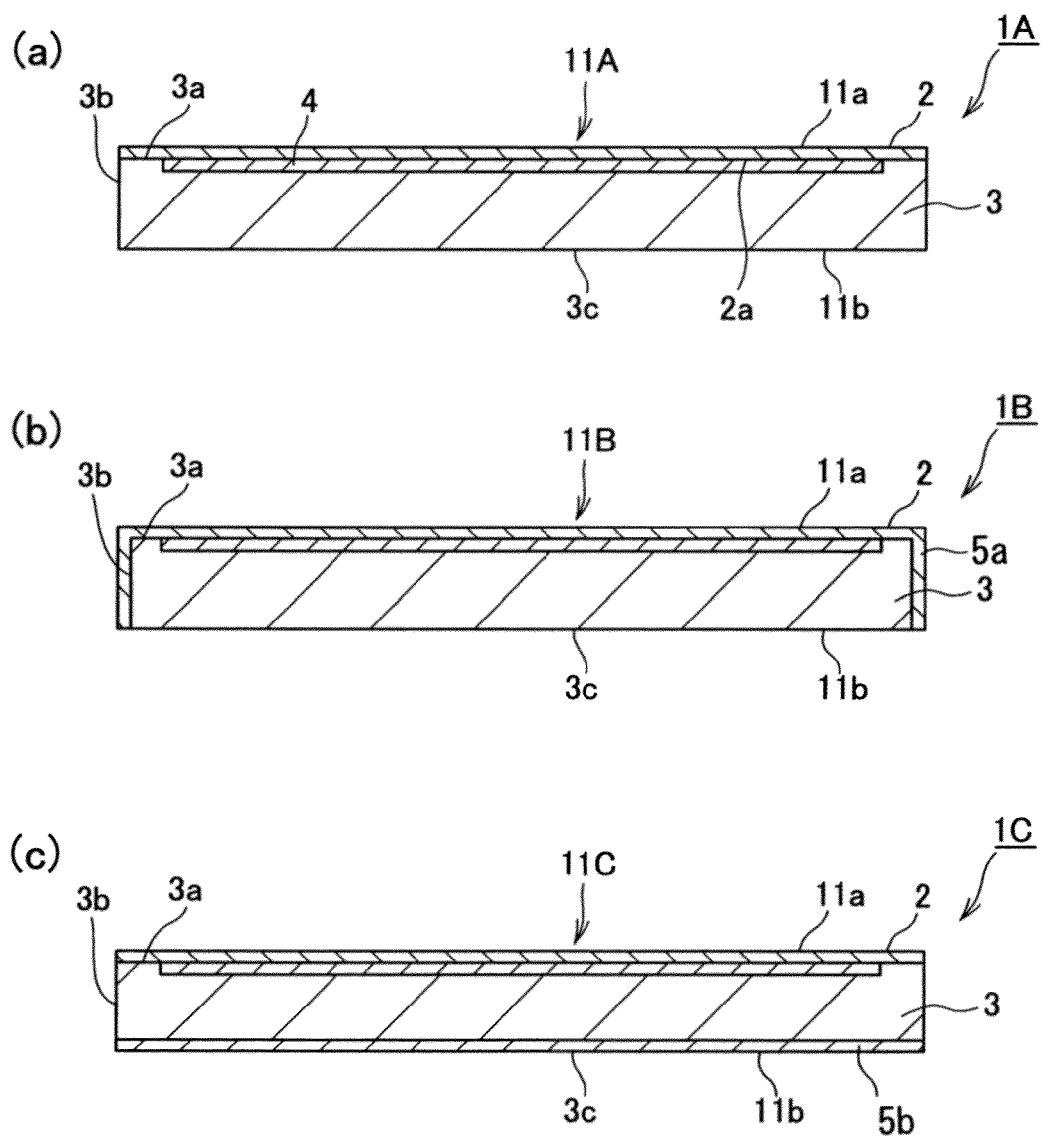
FIGS. 6 (a), (b) and (c) are cross sectional views schematically showing electrostatic chucks 1A, 1B and 1C, respectively, according to embodiments of the present invention.
Figure 7:
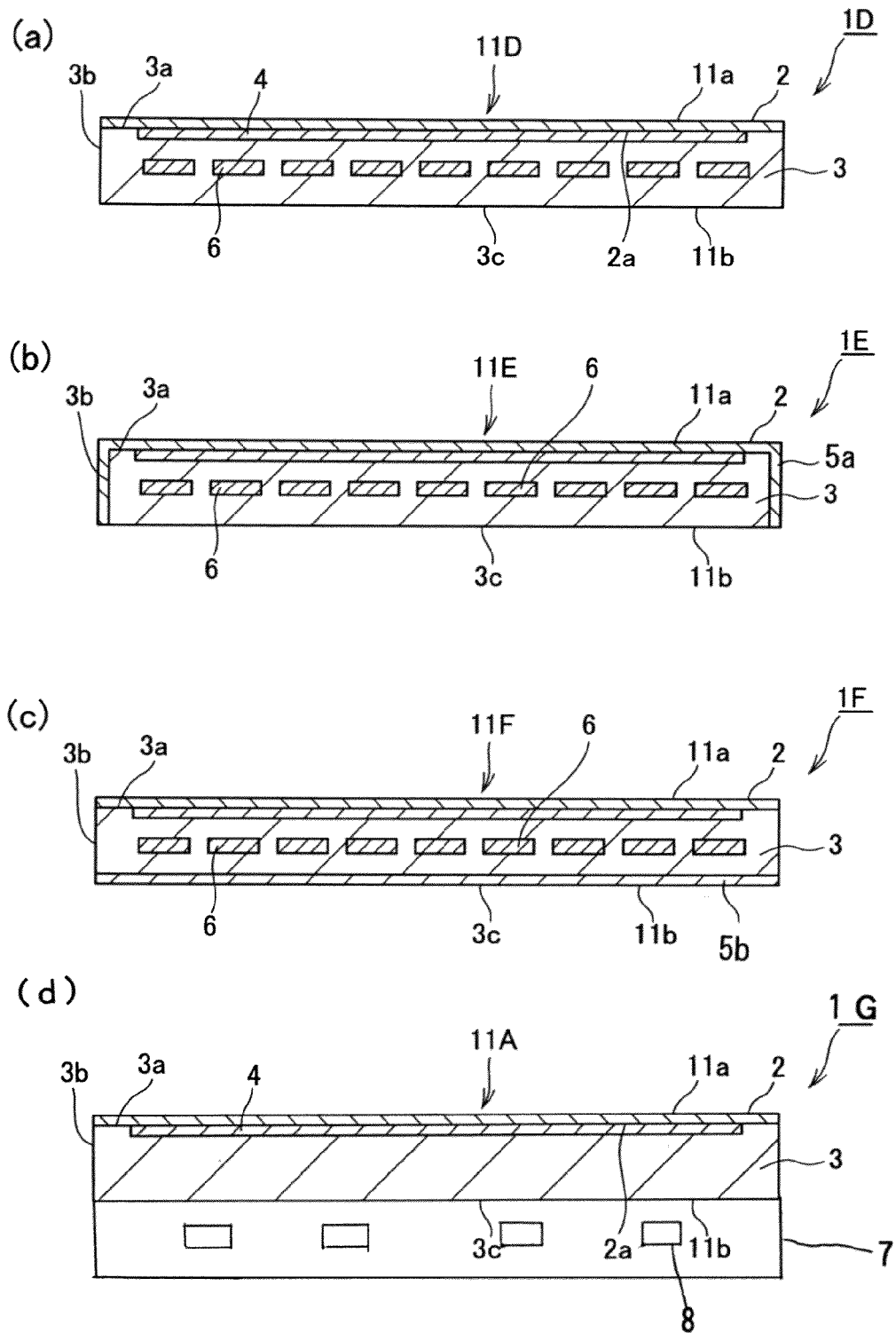
FIGS. 7 (a), (b) and (c) are cross sectional views schematically showing electrostatic chucks 1D, 1E and 1F, respectively, according to embodiments of the present invention.

Electrostatic chucks of the present invention will be described below, appropriately referring to FIG. 6 to 8.

According to an electrostatic chuck 1A shown in FIG. 6(a), a susceptor 11A is composed of a plate shaped main body 3 and a dielectric layer 2. According to the present example, a back face 3c of the plate shaped main body 3 forms a back face 11b of the susceptor 11A. The dielectric layer 2 is provided on the side of an upper face 3a of the plate shaped main body 3, and an upper face of the dielectric layer 2 forms an adsorption face 11a. According to the present example, an electrostatic chuck electrode 4 is formed on the upper face 2a of the dielectric layer 2 on the side of the plate shaped main body. According to the present example, a side face 3b and back face 3c of the plate shaped main body 3 are not covered with a corrosion resistant layer.

According to the present example, the dielectric layer 2 forms a surface corrosion resistant layer, which is formed of the ceramic material of the present invention.

The adsorption face 11a is not necessarily flat over the whole face, and the adsorption face may be roughened, or it may be formed a groove having a size comparable with that of the substrate or a groove for flowing purge gas.

According to an electrostatic chuck 1B shown in FIG. 6(b), a susceptor 11B is composed of a plate shaped main body 3 and a dielectric layer 2. According to the present example, a back face 3c of the plate shaped main body 3 forms a back face lib of the susceptor 11B. The dielectric layer 2 is provided on the side of an upper face 3a of the plate shaped main body, and an upper face of the dielectric layer 2 forms an adsorption face 11a. According to the present example, it is further provided a side face corrosion resistant layer 5a covering a side face 3b of the plate shaped main body.

According to the present example, the dielectric layer 2 forms the surface corrosion resistant layer, and formed of the ceramic material of the present invention. The side face corrosion resistant layer 5a was formed of the ceramic material described above. The corrosion of the side face of the susceptor would become a cause of particles as well as the change of thermal radiation characteristics from the side face, which adversely affects the temperature uniformity on wafer.

According the present embodiment, it is possible to prevent corrosion on the side of the wafer as well as of the side face.

According to an electrostatic chuck 1C shown in FIG. 6(c), a susceptor 11C is composed of a plate shaped main body 3 and a dielectric layer 2. According to the present example, a back face 3c of the plate shaped main body 3 forms a back face 11b of the susceptor 11C. The dielectric layer 2 is provided on the side of an upper face 3a of the plate shaped main body, and an upper face of the dielectric layer 2 forms an adsorption face 11a. According to the present example, it is further provided a back face covering layer 5b covering a back face 3c of the plate shaped main body. According to the present example, the dielectric layer 2 forms the surface covering layer, and is formed of the ceramic material of the present invention. The back face covering layer 5b is also formed of the ceramic material of the present invention.

In the case that a material having a thermal conductivity higher than that of the ceramic material is used as a material of the plate shaped main body, the temperature uniformity on wafer is improved due to the thermal conduction in the plate shaped main body as a whole. However, in this case, since an amount of heat dissipation from the back face 3c of the plate shaped main body 3 is also increased, there is a possibility that the temperature uniformity on wafer may be deteriorated due to the uneven thermal radiation. According to the present embodiment, since the back face covering layer made of the ceramic material is provided on the side of the back face of the plate shaped main body, it is possible not only to realize the corrosion resistance on the side of the back face, but also to reduce the thermal radiation from the back face of the susceptor as a whole, so that the temperature uniformity on wafer can be further improved.

An electrostatic chuck 1D shown in FIG. 7(a) is same as the electrostatic chuck 1A shown in FIG. 6(a), except that a heat resistance 6 is embedded within the plate shaped main body 3 of the susceptor 11D.

An electrostatic chuck 1E shown in FIG. 7(b) is same as the electrostatic chuck 1B shown in FIG. 6(b), except that a heat resistance 6 is embedded within the plate shaped main body 3 of the susceptor 11E.

An electrostatic chuck 1F shown in FIG. 7(c) is same as the electrostatic chuck 1C shown in FIG. 6(c), except that a heat resistance 6 is embedded within the plate shaped main body 3 of the susceptor 11F.

According to a preferred embodiment, a cooling plate is bonded to a back face of the electrostatic chuck. For example, an electrostatic chuck 1G shown in FIG. 7(d) has a structure with a cooling plate 7 bonded to the back face of the electrostatic chuck of FIG. 6(a). As a matter of course, the cooling plate may be bonded to each back face of each of the electrostatic chucks shown in FIGS. 6(b), 6(c), 7(a), 7(b) and 7(c) to provide an electrostatic chuck of integrated type. The cooling plate has a planar structure made of a metal material, such as aluminum, and includes a passage (preferably water passage) 8 of a cooling agent, so as to assist the function of ascending or descending of the temperature of the electrostatic chuck.

Although the heating member may preferably be embedded within the susceptor, the heating member may be fitted to the susceptor. Alternatively, the heating member may be an outer heating member, such as an infrared ray heating device, fitted at a position distant from the susceptor.

Figure 8:
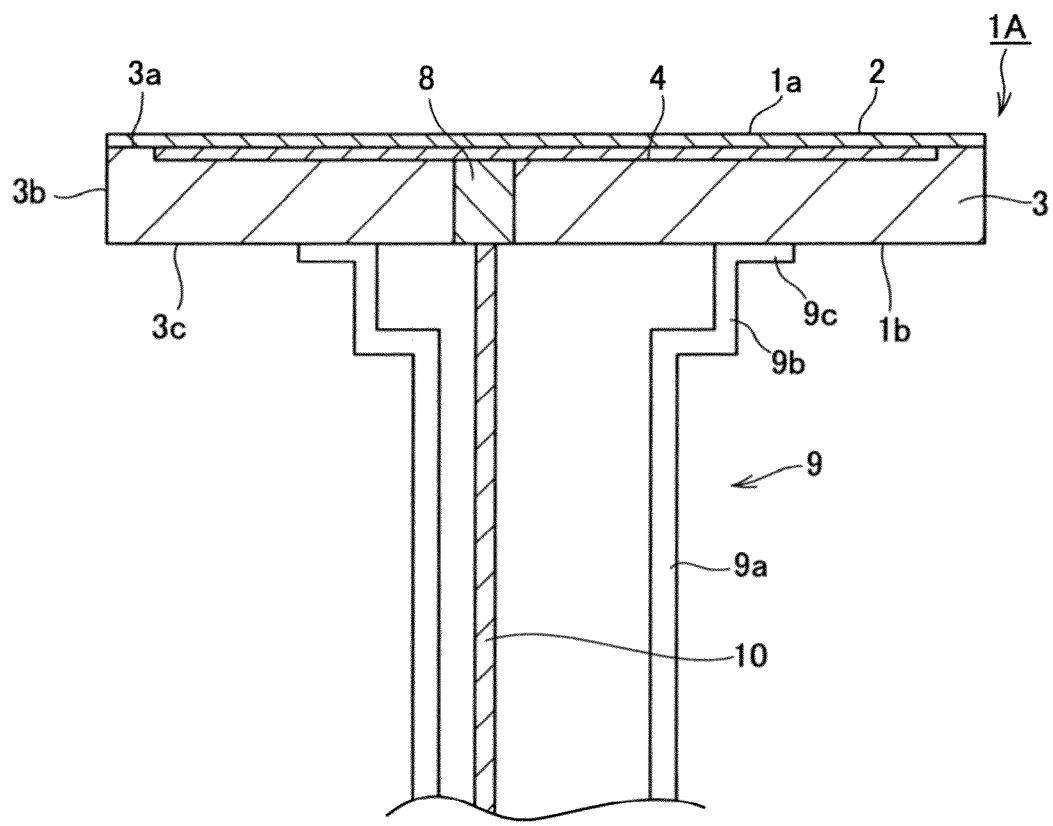
FIG. 8 is a cross sectional view schematically showing an electrostatic chuck according to an embodiment of the present invention.

Further, a supporting part may be provided as shown in FIG. 8. That is, a supporting part 9 is bonded to a lower face (back face) 3c of the susceptor 1A. According to the present example, the supporting part is tube shaped and a member 10 for supplying electricity is contained inside of the supporting part 9. The member for supplying electricity is connected to the electrostatic chuck electrode 4 through an electrical supply terminal 8.

It is preferred that the supporting part includes a step therein, a large size part 9b is provided on the side of the susceptor and a small size part 9a is provided on the opposite side with respect to the step. A flange 9c is formed on an end part of the large size part 9b. Then, the end part of the large size part is bonded to the back face of the susceptor so that the center axis of the supporting part is concentric with that of the susceptor.

The susceptor is plate shaped and preferably, substantially circular disk shaped. Although the size of the susceptor is not particularly limited, the diameter is 280 to 380 mm and thickness is 8 to 20 mm, for example.

Further, in the case that the supporting part is provided, an outer diameter of a bonding part of the susceptor and supporting part is 40 to 120 mm, for example.

According to the above examples, the dielectric layer is composed of one surface corrosion resistant layer. However, the dielectric layer may be composed of the surface corrosion resistant layer and one or more intermediate layer, and in this case, it is possible to further improve the adhesive strength of the dielectric layer and plate shaped main body.

It will be described an example of using an electrostatic chuck of the present embodiment. A wafer is mounted on an adsorption face of the electrostatic chuck, and direct current high voltage is applied onto the electrode 4 through the electrical supply terminal of the electrode 4 to generate electrostatic force, so as to adsorb the wafer on the adsorption face. Further, a heater electrical source is connected to the electrical supply terminal of the resistance heater to control the supplied electrical power, so that the temperature of the wafer is controlled at a predetermined temperature. Under this condition, the wafer is subjected to plasma CVD film formation or plasma etching.

(Heating Member and Electrostatic Chuck Electrode)

A wire conductor may be bent and processed to a wounded body, which may be used as the electrostatic chuck electrode or heating member, for example. The wire diameter of the heating member is about 0.3 to 0.5 mm, and the winding diameter in the case of a coil shaped member is about 2 to 4 mm and the pitch is about 1 to 7 mm. The "winding diameter" referred to herein means an inner diameter of the coil.

As the shape of the heating member or electrostatic chuck electrode, in addition to the coil shape, various shapes may be applied such as ribbon, mesh, coil spring, sheet, film, printed electrode or the like. Further, in a part adjoining a through hole formed for supplying purge gas, lift pin or the like, the pattern of the heating member may be optionally changed, for example, the heating member may be turned away from the through hole.

As the material of the heating member or electrostatic chuck electrode, it may be preferably used a conductive material with a high melting point such as molybdenum (Mo), tungsten (W), niobium (Nb), tungsten-molybdenum compound, or the like.

Further, alumina powder may be mixed with a printing paste containing powder of conductive material having a high melting point, such as tungsten, niobium, molybdenum, the alloys thereof, tungsten/molybdenum compound, tungsten carbide or the like, to provide a cermet.

(Material of Plate Shaped Main Body)

Materials of the plate shaped main body include aluminum oxide, yttrium oxide, aluminum nitride, and may particularly preferably be aluminum oxide, yttrium oxide or aluminum nitride.

In particular, by forming the plate shaped main body with a material including aluminum nitride as its main phase, it is possible to maintain high thermal conductivity and easier to maintain the surface temperature of the corrosion resistant ceramic material uniform.

According to a preferred embodiment, a difference between the thermal expansion coefficient of the plate shaped main body and that of the surface corrosion resistant layer is 0.3 ppm/K or smaller. In this case, when the plate shaped main body and the corrosion resistant layer are bonded with each other at a high temperature (for example bonded by integrated sintering) or when the laminated body is repeatedly used at high and low temperatures, the risk of cracks and peeling can be avoided.

The plate shaped main body and each of the corrosion resistant layer and back face covering layer may be bonded through the intermediate layer. It is thereby possible to further prevent the peeling of the corrosion resistant layer and back face covering layer due to the difference of the thermal expansion coefficients, for example. The intermediate layer is made a layer whose properties are between those of the plate shaped main body and the corrosion resistant layer or back face covering layer.

Specifically, the intermediate layer may be a composite ceramics obtained by sintering mixture of the ceramic material described above and materials for the plate shaped main body.

Further, the intermediate layer may be composed of a plurality of layers and the compositions of the intermediate layers may be made different form each other to form a graded material layer.

(Material of Supporting Part)

A material forming the supporting part 9 (so called shaft) is not particularly limited and includes the followings.

Aluminum nitride, alumina, spinel, magnesium oxide

Preferably, the material of the supporting part is made the ceramic material described above. Even in this case, however, the ceramic materials forming the susceptor and supporting part are not necessarily identical and may be of compositions different from each other in the composition range as described above.

The inventors considered the cause of the deterioration of temperature uniformity when the temperature is deviated from a designed temperature, and speculated that the contribution of radiation thermal conduction becomes predominant among three kinds of thermal conduction patterns at a high temperature. For example, the supporting part is bonded to the central portion of the susceptor, so that solid thermal conduction is predominant at a low temperature and escape of heat from the central portion of the susceptor becomes larger at a low temperature, and the temperature in the central portion is not increased. However, at a high temperature, the contribution of the thermal conduction by radiation becomes relatively large and escape of heat is facilitated in the outer portion without the supporting part than the central portion of the susceptor. The heat dissipation by radiation in the outer portion becomes relatively large, so that the temperature in the outer portion becomes lower than that of the central portion and the temperature uniformity is deteriorated at a high temperature. As a result, by forming the supporting part with the ceramic material as described above, since its thermal conduction is lower than that of aluminum nitride or the like, it is easier to obtain good temperature uniformity over a wide range of operation temperature.

(Production of Electrostatic Chuck)

Although it is not limited a method of producing the electrostatic chuck of the present invention, a preferred production method will be described referring to FIG. 9.

(a) According to the production method described above, mixture of magnesium oxide powder, alumina powder and aluminum nitride powder is sintered to obtain a dense sintered body. That is, the formulated powder described above is subjected to uniaxial pressure molding to produce a plate shaped molded body. The molded body is subjected to hot press sintering to obtain a ceramic sintered body 2A for the dielectric layer.

(b) Then, as shown in FIG. 8(a), one face 2a of the sintered body 2A is polished to form a flat surface. According to the procedure described below, the sintering temperature of producing the sintered body for the plate shaped main body is lower than, or comparable with, that of a sintered body for the dielectric layer. It is thus considered that the surface flatness of the polished surface formed in the step (b) is maintained as it is. Therefore, the surface flatness of the main face 2a forming the electrode in the sintered body finally becomes a parameter considerably contributing to a deviation of thickness, which is defined as a deviation of thickness from the adsorption face of wafer to a flat plate shaped electrode. Then, for lowering the deviation of thickness to 100 μm or smaller, the surface flatness of the face 2a polished in the step (b) may preferably be 10 μm or smaller and more preferably be 5 μm or smaller.

(c) Then, as shown in FIG. 8(b), the electrostatic chuck electrode 4 is formed on the polished face 2a of the sintered body 2A.

For example, the electrode and heating resistance can be formed by printing on the surface of the sintered body by screen printing or the like. In this case, it is preferable that alumina powder is added to a printing paste containing powder of a high melting point conductive material such as tungsten, niobium, molybdenum, the alloys thereof and tungsten carbide. It is thereby possible to improve the adhesion between the main body and the electrode or heating resistance. The material of the electrode may preferably have a thermal expansion coefficient whose difference from that of the sintered body is small, and may more prefrerablypreferably be molybdenum carbide or tungsten carbide, for example. The average particle diameter of the electrode material may preferably be 0.4 μm or smaller and more preferably be 0.2 μm or smaller. Further, the electrode may be also formed by mounting, on the sintered body, a bulk body (metal mesh) of a conductive material with a high melting point having a shape of a mesh, a bulk body (punching metal) of a conductive material having a high melting point with many holes provided therein, or the like. Further, the heating resistance may be also formed by mounting, on the sintered body, a bulk body of a coil made of a wire of a conductive material having a high melting point, or a bulk body (metal mesh) of a conductive material having a high melting point having a shape of a mesh.

(d) As shown in FIG. 8(c), on the main face 2a where the electrode paste is printed on the sintered body, raw material containing ceramics such as alumina as its main component is molded to produce a molded body 14. The average particle diameter of the powder may preferably be 0.2 μm or smaller. The powder is molded and then pressurized in a direction of an axis and sintered under inert gas atmosphere such as nitrogen gas or argon gas.

In the case of alumina, it is preferred that the sintering is performed in 1250 to 1350° under inert gas atmosphere such as nitrogen gas or argon gas. Further, until the maximum temperature, it is preferred that the temperature is elevated at an elevation speed of 200° C./hour or lower. Further, it is preferred to hold at the maximum temperature for 1 to 10 hours. Although the sintering method is not limited, it is preferred to apply hot press sintering, because it can be obtained a dense alumina sintered body and the volume resistivity of the thus obtained alumina sintered body can be further improved. In this case, the applied pressure may preferably be 10 to 30 MPa, because it is possible to obtain more dense sintered body for the main body.

When the sintering temperature of the surface corrosion resistant layer is 1750° C. or higher, the re-sintering of the surface corrosion resistant layer hardly occurs at the sintering temperature of the alumina sintered body. As a result, it is possible to prevent the deformation of the surface corrosion resistant layer and swells of the flat plate shaped electrode at the sintering temperature of the alumina sintered body. Further, the alumina sintered body finally constitute the plate shaped main body, and it is thus required that the main body is not broken by insulation breakage upon the application of a voltage between the wafer and flat plate shaped electrode, so that the main body is required to be dense.

(e) Then, as shown in FIG. 9(d), a main face 12 of the sintered body 2A opposing to the aluminum nitride powder sintered body 3 is polished to form a wafer adsorption face 1a. It is thus possible to obtain a susceptor having a thickness deviation of 100 μm or smaller, which indicates deviation of thickness from the wafer adsorption face to the electrode 4.

That is, since swells are not generated in the electrode 4 at the sintering temperature of the alumina sintered body, it is possible to maintain the thickness deviation from the wafer adsorption face to the flat plate shaped electrode at a small value. A through hole is formed in the central portion of the back face of the plate shaped main body 3 of the susceptor to the flat plate shaped electrode, and the cylindrical terminal 8 (refer to FIG. 8) is fitted into the through hole, so that a voltage can be applied through the terminal to the flat plate shaped electrode.

(Halogen Based Corrosive Gas)

The inventive susceptor is superior in the corrosion resistance against the halogen based corrosive gas and its plasma, and especially excellent in the corrosion resistance against the following halogen based corrosive gasses, the mixtures and plasmas.

$NF_3$, $CF_4$, $ClF_3$, $Cl_2$, $BCl_3$, HBr

EXAMPLES

Production and Evaluation of Ceramic Material

Preferred applications of the present invention will be described below. As MgO, $Al_2O_3$ and AlN raw materials, they were used commercial products each having a purity of 99.9 mass percent or higher and an average particle size of 1 μm or lower in Experiment Nos. 1 to 16. In Experiment Nos. 17 to 28, they were used commercial product having a purity of 99.4 mass percent and an average particle diameter of 3 μm as MgO raw material, commercial product having a purity of 99.9 mass percent and an average particle diameter of 0.5 μm as $Al_2O_3$ raw material, and commercial product having a purity of an average particle diameter of 1 μm or smaller used in the Experiment Nos. 1 to 16 as AlN raw material. Here, as about 1 percent of oxygen is inevitable in the AlN raw material, the above described purity is calculated after oxygen content is excluded from the impurity contents. Further, the Experiment Nos. 1 to 4, 7 to 17, 21 and 23 to 28 correspond to inventive examples, and the Experiment Nos. 5, 6, 18 to 20 and 22 correspond to comparative examples.

(Experiment Nos. 1 to 3)
(Formulation)
Raw materials of MgO, $Al_2O_3$ and AlN were weighed according to the mass % shown in table 1, and then wet-mixed using isopropyl alcohol as a solvent, nylon pot and alumina grinding stone with a diameter of 5 mm for 4 hours. After the mixing, slurry was collected and dried in nitrogen flow at 110° C. Thereafter, the dried matter was passed through a sieve of 30 mesh to obtain formulated powder. Besides, the molar ratio of Mg/Al in the formulated powder was 2.9.

(Molding)
The formulated powder was subjected to uniaxial press molding at a pressure of 200 $kgf/cm^2$ to produce a disk-shaped molded body having a diameter of about 35 mm and a thickness of about 10 mm, which was then contained in a graphite mold for sintering.

(Sintering)
The disk-shaped body was subjected to hot press sintering to obtain the ceramic material. The hot press sintering was performed at a pressure of 200 $kgf/cm^2$ and at a sintering temperature (the maximum temperature) shown in table 1, in Ar atmosphere until the completion of the sintering. The holding time at the sintering temperature was made 4 hours.

(Experiment 4)
The ceramic material was obtained according to the same procedure as the Experiment 1, except that the sintering temperature was set at 1650° C.

(Experiment 5)
The ceramic material was obtained according to the same procedure as the Experiment 1, except that only the MgO raw material was used and that the sintering temperature was set at 1500° C.

(Experiment 6)
The ceramic material was obtained according to the same procedure as the Experiment 1, except that raw materials of MgO and $Al_2O_3$ were weighed according to the mass % shown in table 1 and that the sintering temperature was set at 1650° C.

(Experiments 7 to 16)
The ceramic material was obtained according to the same procedure as the Experiment 1, except that raw materials of MgO, $Al_2O_3$ and AlN were weighed according to the mass % shown in table 1, and that the sintering temperature was made that shown in table 1.

(Experiments 17 to 21)
The ceramic material was obtained according to the same procedure as the Experiment 1, except that raw materials of MgO, $Al_2O_3$ and AlN were weighed according to the mass % shown in table 3, that the molding pressure of the powder mixture was made 100 $kgf/cm^2$, that the diameter of the sample was made 50 mm, that the atmosphere during the sintering was made $N_2$, and that the sintering temperature (maximum temperature) was made that shown in table 3.

(Experiment 22)
The powder mixture was obtained by performing the formulation step according to the same procedure as the Experiment 1, except that raw materials of MgO, $Al_2O_3$ and AlN were weighed according to the mass % shown in table 3. The powder mixture was subjected to uniaxial press molding at a pressure of 100 $kgf/cm^2$ to produce a circular disk-shaped molded body having a diameter of 20 mm and a thickness of 15 mm, which was then subjected to CIP molding step at 3000 $kgf/cm^2$. The powder mixture as described above was filled in a graphite crucible with a lid and the molded body was embedded within the powder mixture. The circular disk shaped molded body was subjected to sintering step at ambient temperature to obtain a ceramic material. The sintering step was performed at a sintering temperature (the maximum temperature) shown in table 3, in Ar atmosphere until the completion of the sintering. The holding time at the sintering temperature was made 4 hours.

(Experiment Nos. 23 to 28)

The ceramic material was obtained according to the same procedure as the Experiment 1, except that MgO, $Al_2O_3$ and AlN raw materials were weighed according to the mass % shown in table 3, that grinding stone for the formulation was made nylon balls each containing an iron core and having a diameter of 20 mm, that the pressure during the uniaxial pressure molding was made 100 kgf/cm$^2$ to produce a circular disk-shaped molded body having a diameter of 50 mm and a thickness of 20 mm, that the sintering temperature (maximum temperature) was set as shown in table 3, and that atmosphere during the sintering was made $N_2$ atmosphere.

(Evaluation)

Each of the materials obtained in the Experiments 1 to 28 was processed adapted for various evaluation procedures and the following evaluations were performed. The result of each evaluation was shown in tables 1 to 4. Besides, according to each of the Experiments 1 to 17, another sample having a diameter of 50 mm was also produced and it was proved that the samples provided evaluation results similar to those shown in tables 1 to 4.

(1) Bulk Density, Open Porosity

They were measured according to Archimedean method using pure water as a medium.

(2) Evaluation of Crystal Phase

The material was ground using a mortar and its crystal phase was identified by an X-ray diffraction system. The condition of the measurement was made CuKα, 40 kV, 40 mA, and 2θ=5 to 70° with a sealed tube type X-ray diffraction system ("D8-ADVANCE" supplied by Bruker AXS corporation) used. The step width of the measurement was made 0.02° and, in the case that the diffraction angle of the peak top was determined, 10 mass percent of Si standard sample powder (SRM640C) supplied by NIST was added as internal standard to adjust the peak position. The diffraction angle of peak top of magnesium oxide was made that of ICDD78-0430. The peak distance shifts and integration width of the MgO—AlN solid solution and magnesium oxide were calculated as follows.

(2)-1: Calculation of Peak Distance (Peak Shift)

For comparing relative amounts of Al and N dissolved into the MgO—AlN solid solution, the peak distance (peak shift) was evaluated with respect to (220) face of the MgO—AlN solid solution. The peak distance was defined as a difference between the diffraction angle of the peak top of (220) face of the MgO—AlN solid solution and the diffraction angle (62.3°) of (220) face of magnesium oxide described in ICDD78-0430.

(2)-2: Calculation of Integration Width

For comparing the crystallinity of the MgO—AlN solid solution relatively, the integration width was calculated. The integration width was calculated by dividing the peak area of the (200) peak of the MgO—AlN solid solution with the intensity (Imax) of the peak top. The peak area was obtained by subtracting background from the intensity and by integrating the intensity in a range of −1° to +1° with respect to the diffraction angle of the peak top. The formula used for the calculation was shown below. Besides, the background was defined as the peak intensity at the diffraction angle shifted from that of the peak top by −1°. According to the procedure as described above, it was calculated the integration width of (111) face of the Si standard sample supplied by NIST, which was proved to be 0.15°.

(Integration width)=$(\Sigma I(2\theta) \times (\text{Step width}))/I\max$ 2 (3): Calculation of Ratio of XRD Peak Intensities of the Magnesium-Aluminum Oxynitride Phase and the MgO—AlN Solid Solution For relatively comparing the ratio of the magnesium-aluminum oxynitride phase contained as the sub phase, it was calculated the ratio of the XRD peak intensities of the magnesium-aluminum oxynitride phase and MgO—AlN solid solution according to the following procedure. "A" was assigned to the XRD peak intensity of 2θ=47 to 49° of the magnesium-aluminum oxynitride phase, "B" was assigned to the XRD peak intensity of (220) face of the MgO—AlN solid solution of 2θ=62.3 to 65.2°, and the value of "A/B" was calculated. Here, the XRD peak intensity "A" was assigned as the integration intensity of the XRD peak of 2θ=47 to 49° after subtracting the background, and the XRD peak intensity "B" was assigned as the integration intensity of the XRD peak of (220) face of the MgO—AlN solid solution after subtracting the background. Besides, the calculation was performed using a commercial software "JADE5" supplied by MDI corporation.

(2)-4: Calculation of Contents of Heterogeneous Phases

Next, for relatively comparing the contents of heterogeneous phases with respect to the whole, the ratio of XRD peak areas was calculated according to the following procedure. It was calculated a value of (a+c+d)/(a+b+c+d), provided that "a" was assigned to an area of the XRD peak of 2θ=47 to 49° of the magnesium-aluminum oxynitride phase, "b" was assigned to an area of the XRD peak of (220) face of the MgO—AlN solid solution of 2θ=62.3 to 65.2°, "c" was assigned to an area of the XRD peak of (400) face of spinel (MgAl2O4) in the vicinity of 2θ=45.0° and "d" was assigned to an area of the XRD peak of (002) face of aluminum nitride (AlN) in the vicinity of 2θ=36.0°, Here, the XRD peak areas "a", "b", "c" and "d" were defined as the peak areas at the respective angles, which were calculated using peak search function of a commercial software "JADE5" supplied by MDI corporation. As to the conditions of peak search using "JADE5", parabola filter was applied for filter type, peak top was applied for the definition of peak position, and as to threshold value and range, threshold value o=3.00, peak intensity % cut-off=0.1, range of BG determination=1.0, point number of BG standardization=7, range of angle=5.0 to 70.0, and further, valuable filter length (data point) was ON, Kα2 peak was elimination ON, and existing peak list was elimination ON. Further, the calculation procedure as described above was used to obtain the ratio of the peak area "a" and peak area "b", and the value of a/b.

(3) Etching Rate

The surface of each of the materials was polished to a mirror face, which was then subjected to corrosion resistance test using an ICP plasma corrosion resistance test system according to the following conditions. The step of a masked face and exposed face was measured by a step gauge and the step value was divided by a test time period to calculate the etching rate of each material.

ICP: 800 W, Bias: 450 W, Introduced gas: NF3/O2/Ar=75/35/100 sccm, 0.05 Torr, Exposed time period: 10 hr, Temperature of sample; Room temperature (4) Constituent Atoms The detection, identification and analysis of content of each constituent atom were performed using EPMA.

(5) Humidity Resistance

Each material was ground using a mortar to obtain powder having a median size of 10 μm or smaller, which was then exposed to saturated water vapor atmosphere at room temperature for 4 hours. It was then measured an amount of dehydration during 40 to 500° C. by TG-DTA system.

(6) Humidity Resistance of a Bulk Material

The surface of each material was polished to a mirror face and then exposed to air at 40° C. and having a relative humidity of 90 percent for 28 days. It was then observed the surface of the sample by means of a scanning type electron microscope ("XL30" supplied by Philips Corporation), and "○" was assigned to the case of no change, "X" was assigned to the case that needle-like or granular matters were precipitated over 40 percent or more of the surface, and "Δ" was assigned to the case between them.

(7) Water Resistance of Bulk Material

The surface of each material was polished to a mirror face and then immersed in water at room temperature for 15 days. It was then observed the surface of the sample by means of a scanning type electron microscope, and "○" was assigned to the case of no change, "X" was assigned to the case that traces of dissolving was observed over 40 percent or more of the surface, and "Δ" was assigned to the case between them.

(8) Fracture Toughness

It was measured a fracture toughness by SEPB method according to JIS-R1607.

(9) Bending Strength

It was measured by bending strength test according to JIS-R1601.

(10) Measurement of Volume Resistivity

It was measured by a method according to JIS-C2141 in air at room temperature. The shape of a test sample was of a diameter of 50 mm×(0.5 to 1 mm), and a main electrode with a diameter of 20 mm, a guard electrode with an inner diameter of 30 mm and an outer diameter of 40 mm and an applying electrode with a diameter of 40 mm were formed, while the electrodes were made of silver. A voltage of 2 kV was applied and it was read a current value at a time point 1 minute after the application of the voltage, and the current value was used to calculate a volume resistivity at room temperature.

Further, as to the Experiment Nos. 1, 3, 6, 12, and 23 to 28, it was measured in vacuum (0.01 Pa or below) by the same procedure and at 600° C. The shape of a test sample was of a diameter of 50 mm×(0.5 to 1 mm), and a main electrode with a diameter of 20 mm, a guard electrode with an inner diameter of 30 mm and an outer diameter of 40 mm and an applying electrode with a diameter of 40 mm were formed while the electrodes were made of silver. A voltage of 500V/mm was applied and it was read a current value at a time point 1 hour after the application of the voltage, and the current value was used to calculate a volume resistivity. Further, in values of the volume resistivity shown in tables 2 and 4, "aEb" represents a $\times 10^b$, and, for example, "1E16" represents $1 \times 10^{16}$.

TABLE 1

| compo-sition | MgO (mass %) | Al$_2$O$_3$ (mass %) | AlN (mass %) | Mg/Al molar ratio | sin-tering temp. (° C.) | bulk density (g/cm$^3$) | open porosity (%) | crystal phase main phase[1] | crystal phase sub phase[2] | MgO—AlNss peak top (111) face (°) | MgO—AlNss peak top (200) face (°) | MgO—AlNss peak top (220) face (°) | (220) faceXRD peak shift[3] (°) | (200) face integration width[4] (°) |
|---|---|---|---|---|---|---|---|---|---|---|---|---|---|---|
| Exp. 1 | 70.7 | 22.0 | 7.2 | 2.9 | 1850 | 3.53 | 0.15 | MgO—AlNss | MgAl$_2$O$_4$, Mg—Al—O—N | 37.22 | 43.26 | 62.85 | 0.55 | 0.26 |
| Exp. 2 | 70.7 | 22.0 | 7.2 | 2.9 | 1800 | 3.54 | 0.04 | MgO—AlNss | MgAl$_2$O$_4$, Mg—Al—O—N | 37.14 | 43.18 | 62.73 | 0.43 | 0.25 |
| Exp. 3 | 70.7 | 22.0 | 7.2 | 2.9 | 1750 | 3.54 | 0.04 | MgO—AlNss | MgAl$_2$O$_4$, Mg—Al—O—N | 36.96 | 43.16 | 62.75 | 0.45 | 0.45 |
| Exp. 4 | 70.7 | 22.0 | 7.2 | 2.9 | 1650 | 3.53 | 0.10 | MgO—AlNss | MgAl$_2$O$_4$, AlN | 36.94 | 42.92 | 62.33 | 0.03 | 0.34 |
| Exp. 5 | 100 | — | — | — | 1500 | 3.57 | 0.30 | MgO | — | 36.90 | 42.90 | 62.30 | 0.00 | 0.28 |
| Exp. 6 | 37.0 | 63.0 | — | 0.7 | 1850 | 3.57 | 0.00 | MgAl$_2$O$_4$ | MgO | — | 42.90 | 62.30 | 0.00 | 0.27 |
| Exp. 7 | 60.7 | 29.6 | 9.7 | 1.9 | 1850 | 3.52 | 0.05 | MgO—AlNss | MgAl$_2$O$_4$, Mg—Al—O—N | — | 43.18 | 62.73 | 0.43 | 0.26 |
| Exp. 8 | 60.7 | 29.6 | 9.7 | 1.9 | 1800 | 3.52 | 0.05 | MgO—AlNss | MgAl$_2$O$_4$, Mg—Al—O—N | — | 43.18 | 62.73 | 0.43 | 0.32 |
| Exp. 9 | 60.7 | 29.6 | 9.7 | 1.9 | 1750 | 3.52 | 0.05 | MgO—AlNss | MgAl$_2$O$_4$, Mg—Al—O—N | — | 43.04 | 62.65 | 0.35 | 0.49 |
| Exp. 10 | 61.2 | 25.2 | 13.5 | 1.9 | 1800 | 3.49 | 0.02 | MgO—AlNss | MgAl$_2$O$_4$, Mg—Al—O—N | — | 43.20 | 62.75 | 0.45 | 0.31 |
| Exp. 11 | 66.2 | 24.1 | 9.7 | 2.3 | 1800 | 3.52 | 0.01 | MgO—AlNss | MgAl$_2$O$_4$, Mg—Al—O—N | — | 43.20 | 62.75 | 0.45 | 0.28 |
| Exp. 12 | 71.2 | 18.8 | 10.1 | 2.9 | 1800 | 3.52 | 0.03 | MgO—AlNss | Mg—Al—O—N | 37.24 | 43.26 | 62.83 | 0.53 | 0.30 |
| Exp. 13 | 56.1 | 28.6 | 15.3 | 1.5 | 1800 | 3.47 | 0.05 | MgO—AlNss | MgAl$_2$O$_4$, Mg—Al—O—N | — | 43.18 | 62.73 | 0.43 | 0.30 |
| Exp. 14 | 85.0 | 11.3 | 3.7 | 10.6 | 1800 | 3.55 | 0.07 | MgO—AlNss | MgAl$_2$O$_4$, Mg—Al—O—N | 37.06 | 43.08 | 62.53 | 0.23 | 0.25 |
| Exp. 15 | 72.6 | 9.3 | 18.2 | 2.9 | 1800 | 3.46 | 0.00 | MgO—AlNss | Mg—Al—O—N | 36.98 | 42.98 | 62.41 | 0.11 | 0.27 |
| Exp. 16 | 74.0 | 24.7 | 1.3 | 3.6 | 1800 | 3.56 | 0.19 | MgO—AlNss | MgAl$_2$O$_4$ | — | 42.94 | 62.37 | 0.07 | 0.25 |

Notes for table 1
[1] MgO—AlNss: MgO—AlN solid solution (Cubic crystal system)
[2] Mg—Al—O—N: Mg, Al oxynitride
[3] Distance between XRD peaks of (220) face of MgO—AlNss and (220) face of MgO
[4] Integration width of (200) face of MgO—AlNss

TABLE 2

| composition | XRD peak A/B[1] | XRD peak[2] a/b | XRD peak[2] (a + c + d)/ (a + b + c + d) | etching rate (nm/h) | water reduction rate (%) | bulk material humidity resistance[3] | bulk material water resistance[4] | fracture toughness[5] | strength (MPa) | volume resistivity (Ω·cm) | volume resistivity 600° C. (Ω·cm) |
|---|---|---|---|---|---|---|---|---|---|---|---|
| Exp. 1 | 0.004 | <0.001 | 0.052 | 109 | 1.8 | ○ | ○ | — | 65 | — | 8E9 |
| Exp. 2 | 0.004 | <0.001 | 0.081 | 112 | 1.9 | ○ | ○ | 2.2 | 145 | >1E17 | — |
| Exp. 3 | 0.003 | <0.001 | 0.096 | 110 | 1.9 | ○ | Δ | 2 | 171 | >1E17 | 3E10 |
| Exp. 4 | 0.000 | 0.000 | 0.483 | 168 | 2.2 | Δ | X | — | 275 | — | — |
| Exp. 5 | 0.000 | 0.000 | 0.000 | 104 | 6.5 | X | X | 2.2 | 240 | >1E17 | 2E12 |
| Exp. 6 | 0.000 | 0.000 | 0.852 | 202 | 2.7 | X | X | — | — | — | — |
| Exp. 7 | 0.058 | 0.063 | 0.225 | 142 | 1.6 | ○ | ○ | 2.6 | 204 | — | — |
| Exp. 8 | 0.039 | 0.036 | 0.207 | 146 | 1.7 | ○ | ○ | 2.5 | 222 | >1E17 | — |
| Exp. 9 | 0.052 | 0.059 | 0.308 | 147 | 1.9 | ○ | Δ | 2.5 | 243 | — | — |
| Exp. 10 | 0.074 | 0.074 | 0.167 | 138 | 1.8 | ○ | ○ | 2.7 | 204 | >1E17 | — |
| Exp. 11 | 0.031 | 0.030 | 0.118 | 143 | 1.8 | ○ | ○ | 2.5 | 183 | — | — |
| Exp. 12 | 0.023 | 0.024 | 0.018 | 93 | 1.4 | ○ | ○ | 1.9 | 152 | — | 2E10 |
| Exp. 13 | 0.138 | 0.136 | 0.246 | 166 | 1.9 | ○ | ○ | 3.1 | 251 | — | — |
| Exp. 14 | 0.005 | 0.006 | 0.027 | 105 | 2.2 | ○ | Δ | 2.1 | 177 | — | — |
| Exp. 15 | 0.125 | 0.128 | 0.117 | 124 | 2.3 | Δ | Δ | 4.4 | 350 | >1E17 | — |
| Exp. 16 | 0.000 | 0.000 | 0.334 | 104 | 2.3 | Δ | X | 2.2 | 185 | — | — |

Notes for table 2

[1] A: Peak intensity of Mg—Al—O—N of 2θ = 47~49°, B: Peak intensity and definition of MgO of 2θ = 62.3~65.2°
[2] It was provided that "a" was assigned to an area of the XRD peak of of 2θ = 47 to 49° of Mg—Al—O—N, "b" was assigned to an area of the XRD peak intensity of (220) face of MgO—AlNss of 2θ = 62.3 to 65.2°, "c" was assigned to an area of the XRD peak of (400) face of spinel (MgAl2O4) in the vicinity of 2θ = 45.0° and "d" was assigned to an area of the XRD peak of (002) face of aluminum nitride (AlN) in the vicinity of 2θ = 36.0°.
[3] It was judged by the change of microstructure before and after exposing a sample whose surface was polished to mirror face in water vapor atmosphere of 40° C. and 90RH % for 28 days. "○" was assigned to the case of no change, "X" was assigned to the case that traces of dissolving was observed over 40 percent or more of the surface, and "Δ" was assigned to the case between them.
[4] It was judged by the change of microstructure before and after immersing a sample whose surface was polished to a mirror face in water at room temperature for 15 days. "○" is assigned to the case of no change, "X" was assigned to the case that traces of dissolving was observed over 40 percent or more of the surface, and "Δ" was assigned to the case between them.
[5] Unit of fracture toughness: MPa·m^(1/2)
[6] [—]: not measured

TABLE 3

| composition | MgO (mass %) | Al₂O₃ (mass %) | AlN (mass %) | Mg/Al molar ratio | sintering temp. (° C.) | bulk density (g/cm³) | open porosity (%) | crystal phase main phase[1] | crystal phase sub phase[2] | MgO—AlNss peak top (111) face (°) | MgO—AlNss peak top (200) face (°) | MgO—AlNss peak top (220) face (°) | (220) faceXRD peak shift[3] (°) | (200) face integration width[4] (°) |
|---|---|---|---|---|---|---|---|---|---|---|---|---|---|---|
| Exp. 17 | 49.0 | 28.2 | 22.8 | 1.1 | 1775 | 3.41 | 0.00 | MgO—AlNss | MgAl₂O₄ Mg—Al—O—N | — | 43.18 | 62.72 | 0.42 | 0.35 |
| Exp. 18 | 70.7 | 22.0 | 7.2 | 2.9 | 1600 | 3.53 | 0.05 | MgO | MgAl₂O₄, AlN | 36.9 | 42.90 | 62.30 | 0.00 | 0.31 |
| Exp. 19 | 60.7 | 29.6 | 9.7 | 1.9 | 1600 | 3.54 | 0.07 | MgO | MgAl₂O₄, AlN | — | 42.90 | 62.30 | 0.00 | 0.30 |
| Exp. 20 | 41.0 | 38.4 | 20.6 | 0.8 | 1800 | 3.43 | 0.04 | MgAl₂O₄, Mg—Al—O—N MgO—AlNss | | — | 43.17 | 62.72 | 0.42 | 0.27 |
| Exp. 21 | 60.7 | 29.6 | 9.7 | 1.9 | 1725 | 3.52 | 0.06 | MgO—AlNss | MgAl₂O₄ Mg—Al—O—N | — | 43.02 | 62.63 | 0.33 | 0.51 |
| Exp. 22 | 61.1 | 38.9 | — | 2.0 | 1850 | — | — | MgO | MgAl₂O₄ | — | 42.90 | 62.30 | 0.00 | 0.24 |
| Exp. 23 | 91.8 | 2.8 | 5.3 | 12.3 | 1850 | 3.55 | 0.00 | MgO—AlNss | AlN | 36.98 | 42.98 | 62.38 | 0.08 | 0.23 |
| Exp. 24 | 91.5 | 4.7 | 3.8 | 12.3 | 1850 | 3.55 | 0.06 | MgO—AlNss | Mg—Al—O—N | 37.00 | 43.00 | 62.42 | 0.12 | 0.21 |
| Exp. 25 | 91.3 | 5.7 | 3.0 | 12.3 | 1850 | 3.55 | 0.00 | MgO—AlNss | MgAl₂O₄ Mg—Al—O—N | 37.02 | 43.00 | 62.44 | 0.14 | 0.19 |
| Exp. 26 | 91.1 | 6.6 | 2.3 | 12.3 | 1850 | 3.55 | 0.04 | MgO—AlNss | MgAl₂O₄ Mg—Al—O—N | 37.04 | 43.04 | 62.50 | 0.20 | 0.18 |
| Exp. 27 | 91.0 | 7.5 | 1.5 | 12.3 | 1850 | 3.54 | 0.10 | MgO—AlNss | MgAl₂O₄ | 37.00 | 43.02 | 62.44 | 0.14 | 0.23 |
| Exp. 28 | 97.0 | 2.2 | 0.8 | 39.0 | 1850 | 3.55 | 0.04 | MgO—AlNss | MgAl₂O₄ | 36.96 | 42.96 | 62.36 | 0.06 | 0.21 |

Notes for table 3:
[1] MgO—AlNss: solid solution of MgO—AlN (cubic crystal system)
[2] Mg—Al—O—N: Mg, Al oxynitride
[3] MgO—AlNss: Distance between XRD peaks of (220) face of MgO—AlNss and (220) face of MgO
[4] Integration width of (200) face of MgO—AlNss

TABLE 4

| composition | XRD peak A/B[1] | XRD peak[2] a/b | XRD peak[2] (a + c + d)/ (a + b + c + d) | etching rate (nm/h) | water reduction rate (%) | bulk material humidity resistance[3] | bulk material water resistance[4] | fracture toughness[5] | strength (MPa) | volume resistivity (Ω·cm) | volume resistivity @600° C. (Ω·cm) |
|---|---|---|---|---|---|---|---|---|---|---|---|
| Exp. 17 | 0.321 | 0.322 | 0.362 | 181 | 1.8 | ○ | ○ | 3.2 | 270 | — | — |
| Exp. 18 | 0.000 | 0.000 | 0.492 | 171 | 3.6 | X | X | — | — | — | — |

TABLE 4-continued

| composition | XRD peak A/B[1] | XRD peak[2] a/b | XRD peak[2] (a + c + d)/ (a + b + c + d) | etching rate (nm/h) | water reduction rate (%) | bulk material humidity resistance[3] | bulk material water resistance[4] | fracture toughness[5] | strength (MPa) | volume resistivity (Ω·cm) | volume resistivity @600° C. (Ω·cm) |
|---|---|---|---|---|---|---|---|---|---|---|---|
| Exp. 19 | 0.000 | 0.000 | 0.352 | 175 | 3.4 | X | X | — | — | — | — |
| Exp. 20 | 0.449 | 0.451 | 0.538 | 201 | 1.9 | ○ | ○ | 3.3 | 275 | — | — |
| Exp. 21 | 0.058 | 0.059 | 0.351 | 154 | 1.9 | ○ | X | 2.6 | 249 | — | — |
| Exp. 22 | 0.000 | 0.000 | 0.491 | — | 3.2 | X | X | — | — | — | — |
| Exp. 23 | 0.000 | 0.000 | 0.025 | — | — | Δ | Δ | — | 173 | >1E17 | 1E11 |
| Exp. 24 | 0.012 | 0.012 | 0.012 | — | — | Δ | Δ | 2.0 | 140 | — | 9E10 |
| Exp. 25 | 0.007 | 0.007 | 0.012 | — | — | Δ | Δ | 2.1 | 180 | — | 9E10 |
| Exp. 26 | <0.001 | 0.001 | 0.014 | — | — | ○ | Δ | 2.0 | 150 | >1E17 | 8E10 |
| Exp. 27 | 0.000 | 0.000 | 0.069 | — | — | Δ | Δ | 1.9 | 116 | — | 9E10 |
| Exp. 28 | 0.000 | 0.000 | 0.019 | — | — | Δ | Δ | 2.0 | 176 | — | 1E11 |

Notes for table 4:
[1] A: Defined as peak intensity of Mg—Al—O—N of 2θ = 47~49°, B: Defined as peak intensity of MgO of 2θ = 62.3~65.2°
[2] It was provided that "a" was assigned to an area of the XRD peak of of 2θ = 47 to 49° of Mg—Al—O—N, "b" was assigned to an area of the XRD peak intensity of (220) face of MgO—AlNss of 2θ = 62.3 to 65.2°, "c" was assigned to an area of the XRD peak of (400) face of MgAl$_2$O$_4$ in the vicinity of 2θ = 45.0°, and "d" was assigned to an area of the XRD peak of (002) face of AlN in the vicinity of 2θ = 36.0°.
[3] It was judged by the change of microstructure before and after exposing a sample whose surface was polished to mirror face in water vapor atmosphere of 40° C. and 90RH % for 28 days. "○" was assigned to the case of no change, "X" was assigned to the case that traces of dissolving was observed over 40 percent or more of the surface, and "Δ" was assigned to the case between them.
[4] It was judged by the change of microstructure before and after immersing a sample whose surface was polished to a mirror face was immersed in water at room temperature for 15 days. "○" was assigned to the case of no change, "X" was assigned to the case that traces of dissolving was observed over 40 percent or more of the surface, and "Δ" was assigned to the case between them.
[5] Unit of fracture toughness: MPa·m$^{1/2}$
[6] [—]: Not measured (Evaluation Results)

As shown in tables 1 to 4, as a result of evaluation of crystalline phases of the ceramic materials according to the Experiment Nos. 1 to 3, 7 to 17, 21 and 24 to 28, it was contained, as the main phase, the MgO—AlN solid solution (MgO—AlNss) whose YRD peaks of (111), (200) and (220) faces were observed in 2θ=36.9 to 39°, 42.9 to 44.8° and 62.3 to 65.2°, respectively between those of cubic crystal of magnesium oxide and cubic crystal of aluminum nitride. It was further contained, as the sub phases, the magnesium-aluminum oxynitride (Mg—Al—O—N) with the XRD peak in at least 2θ=47 to 49° and spinel (MgAl2O4), and AlN was not contained.

Figure 2:
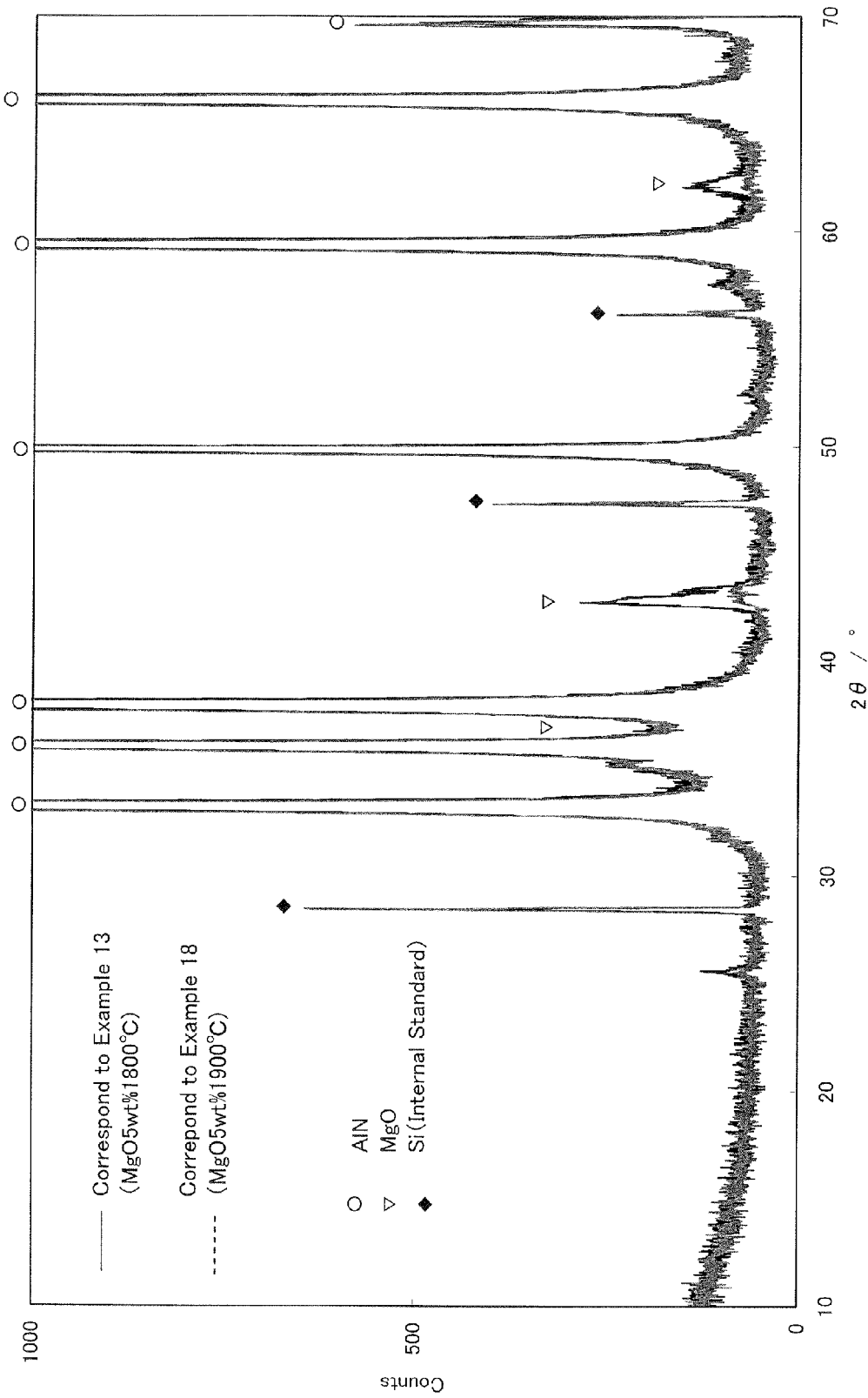
FIG. 2 is an enlarged view of peaks corresponding with MgO—AlN solid solution in the XRD analytical chart of the Experiment 1.

As an representative example, FIG. 1 shows an XRD analytical chart obtained in the Experiment 1, FIG. 2 shows an enlarged view of XRD peaks of the MgO—AlN solid solution according to the Experiment 1, and tables 1 and 3 show (111), (200) and (220) peak tops of the MgO—AlN solid solution, distance (peak shift) between the XRD peak top of (220) face of the MgO—AlN solid solution and peak top of magnesium oxide, and integration width of the XRD peak of (200) face of the MgO—AlN solid solution, in the Experiment Nos. 1 to 28. Besides, according to the Experiment Nos. 6 to 11, 18, 16, 17 and 19 to 21, the peaks of spinel and (111) face of the MgO—AlN solid solution considerably overlap each other, so that it could not be distinguished the peak top of (111) face and table 3 does not contain description of the peak top values of (111) face. As the peak shift was larger, the dissolved amount was larger, and as the integration width was smaller, the state of the dissolution was more homogeneous. Besides, the XRD analytical charts obtained in the Experiment Nos. 2, 3, 7 to 17, 20, 21 and 24 to 28 correspond with these in which the contents of the MgO—AlN solid solution, magnesium-aluminum oxynitride and spinel contained in the Experiment No. 1 were changed, and thus were omitted.

Here, the main phase means a component occupying 50 percent or more in volume ratio, and sub-phase means a phase other than the main phase and whose XRD phase was identified. A ratio of area at an observed cross section was considered to reflect the volume ratio, so that the main phase was defined as an area having an area ratio of 50 percent or more in an EPMA element mapping image and the sub phase was defined as an area other than the main phase. According to the composite material of the Experiment No. 20, as in the Experiment No. 1, it was contained three components of the MgO—AlN solid solution, magnesium-aluminum oxynitride and spinel, and the components were balanced in the contents and any of the components do not constitute the main phase. Therefore, the above three components were described in columns for the main and sub phases in table 3.

Figure 3:
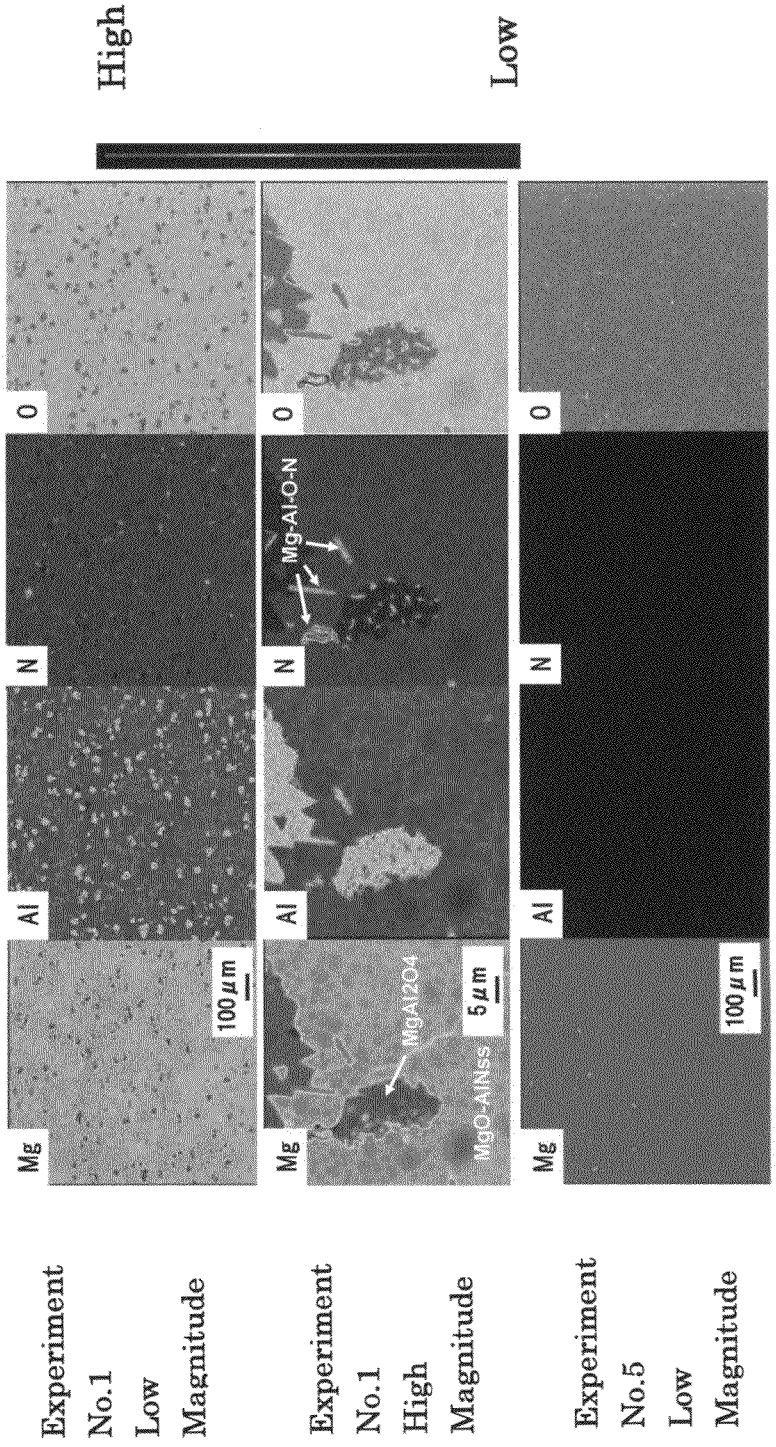
FIG. 3 shows EPMA element mapping images obtained in Experiments 1 and 5.

FIG. 3 shows EPMA element mapping image obtained in the Experiment No. 1. As shown in FIG. 3, the main phase part in the Experiment 1 was mainly formed on Mg and O, and Al and N were detected at the same time, indicating the presence of the MgO—AlN solid solution shown in FIGS. 1 and 2. Further, as the sub phase, it was observed the presence of spinel part and a small amount of magnesium-aluminum oxynitride part. The MgO—AlN solid solution occupied about 86 percent of total area of FIG. 3 to prove that the MgO—AlN solid solution constitutes the main phase in the Experiment No. 1. The same analysis was performed for the other Experiments to prove that the ratios of areas of the MgO—AlN solid solution were about 75 percent, about 91 percent and about 99 percent and the MgO—AlN solid solution forms the main phase, for example, in the Experiment Nos. 15, 26 and 28. Besides, although the main phase and sub phase were distinguished by means of EPMA element mapping as an example, another method may be applied as far as it was distinguishable the volume ratio of each phase.

Besides, an EPMA element mapping image was divided into colors of red, orange, yellow, yellowish green, green, blue and indigo blue depending on the contents, so that red, indigo blue and black correspond to the highest content, the lowest content and zero, respectively. However, as FIG. 3 was shown in monochrome, the following description was given for original colors in FIG. 3 below. According to the Experiment 1 (low magnitude), background was colored in orange and dot parts were colored in blue for Mg, background was colored in blue and dot parts were colored in orange for Al, background was colored in blue and dot parts were colored in indigo for N, and background was colored in orange and dot parts were colored in red for O. According to the Experiment 1 (high magnitude), background (MgO—AlNss) was colored in orange, island parts (MgAl2O4) were colored in blue and line parts (Mg—Al—O—N) were colored in green for Mg, background was colored in blue and island and line parts were colored in orange for Al, background was colored in blue, island parts were colored in indigo and line parts were colored in green for N, and background was colored in orange, island parts were colored in red and line parts were colored in green for O. According to the Experiment 5 (low magnitude), Mg and O were colored in red, and Al and N were colored in black.

Further, both of the ceramic materials according to the Experiment Nos. 4 and 23 contain the MgO—AlN solid solution as described above as the main phase as a result of evaluation of crystalline phases, and that of the Experiment No. 23 contained AlN as the sub phase and that of the Experiment No. 4 contained spinel and AlN as the sub phases. Table 1 shows the distance (peak shift) between the XRD peak of the MgO—AlN solid solution and that of magnesium oxide in the Experiment Nos. 4 and 23. In the case that the sintering temperature was 1650° C. as in the Experiment No. 4, it was speculated that the reaction did not sufficiently proceed and the dissolved amount was small. The reaction hardly occur at a sintering temperature of 1600° C., the MgO—AlN solid solution was not generated in the ceramic materials of the Experiment Nos. 18 and 19.

Further, the ceramic material of the Experiment No. 5 contains MgO as the main phase, and the ceramic material of the Experiment No. 6 contained spinel as the main phase and MgO as the sub phase. Further, the ceramic material of the Experiment No. 22 contained MgO as the main phase and spinel as the sub phase. Therefore, in the case that AlN component was not contained in raw materials, Al component does not dissolve into MgO by both of hot press sintering and sintering at ambient pressure.

Figure 4:
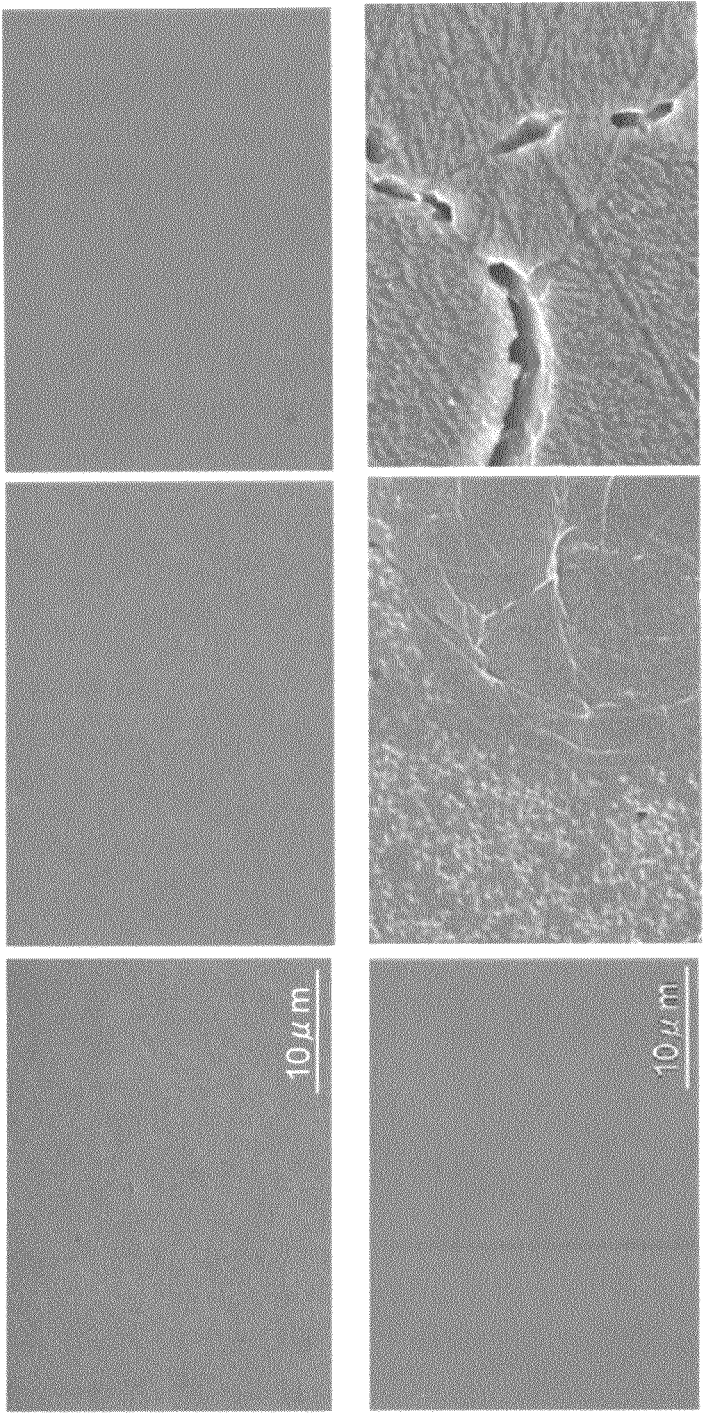
FIG. 4 is a photograph showing microstructure of bulk material of the Experiments 2 and 5 on humidity resistance and water resistance tests.
Figure 5:
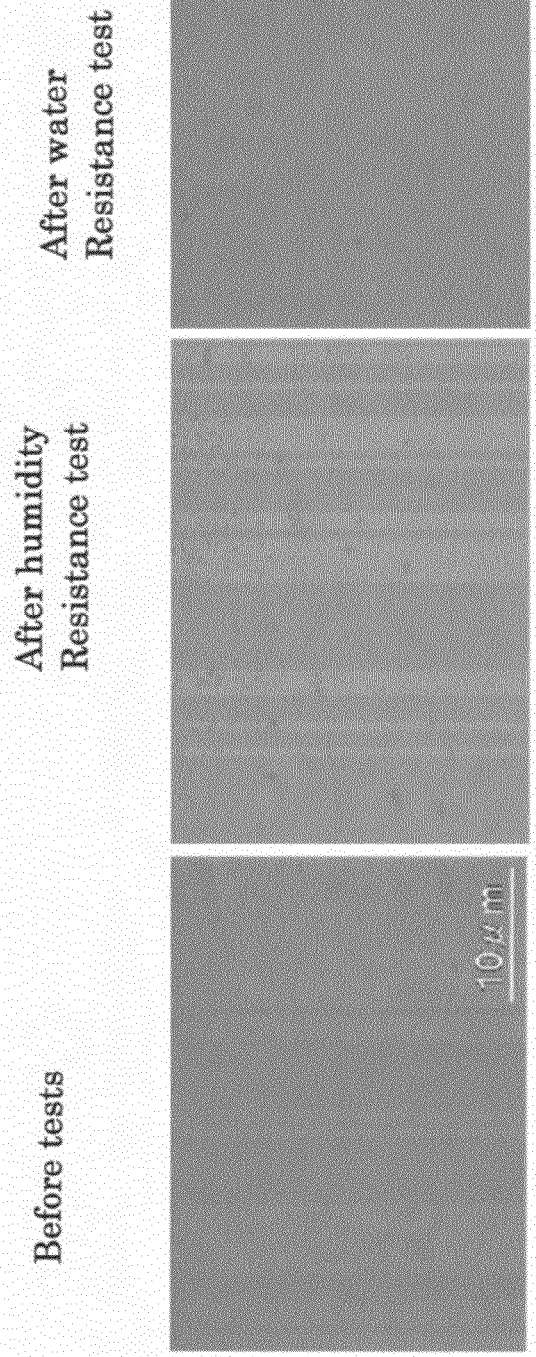
FIG. 5 is a photograph showing microstructure of bulk material of the Experiments 8 and 9 on humidity resistance and water resistance tests.

Then, water reduction rate (mass reduction rate in a range of 40 to 500° C. by TG-DTA) was 2 percent or lower in the ceramic materials according to the Experiment Nos. 1 to 3, 7 to 13, 17, 20 and 21, and the water reduction rate was 3 percent or lower in the ceramic materials according to the Experiment Nos. 4, 6 and 14 to 16. It was proved that the humidity resistance of the materials was considerably superior than that of the ceramic material of the Experiment No. 5, that was, MgO ceramics. As representative examples of humidity resistance and water resistance of the bulk material, FIG. 4 shows photographs showing microstructures of the Experiment No. 2 (left side) and No. 5 (right side), and FIG. 5 shows photographs showing microstructures of the Experiment No. 8 (left side) and No. 9 (right side).

As the dissolved content was larger, the humidity resistance of the bulk material was better. According to the Experiment Nos. 1 to 3, 7 to 14, 17, 20, 21 and 26, the peak shift of (220) face of the MgO—AlN solid solution from that of magnesium oxide was 0.2° or larger, and the surface state was good and not changed after the humidity resistance test of bulk material (exposing to atmosphere at 40° C. and 90 RH % for 28 days). Further, according to the Experiment Nos. 4, 15, 16, 23 to 25, 27 and 28, although the surface state was changed after the humidity resistance test of bulk material, such change was smaller compared with the Experiment Nos. 5, 6, 18, 19 and 22 in which needle-like and granular precipitated matters were formed over 40 percent or more of the surface. As can be seen from the results, it was proved that the humidity resistance of bulk material was dependent on the dissolved content of Al and N components into MgO. That is, in the case that the peak shift of (220) face of the MgO—AlN solid solution from that of magnesium oxide was lower than 0.03°, the change was observed over 40 percent or more of the surface and the humidity resistance was low. In the case that the peak shift was 0.03° or more and smaller than 0.2°, the humidity resistance was good, in the case that the peak shift was 0.2° or larger, the humidity resistance was further improved. That is, in the case that the XRD peak of (220) face of the MgO—AlN solid solution was observed in a range of 62.33° or higher and lower than 62.50° (2θ), which was between the peak of cubic crystal of magnesium oxide and that of cubic crystal of aluminum nitride, the humidity resistance was proved to be good. In the case that the XRD peak was observed in a range higher than 62.50° or higher, the humidity resistance was further improved. Further, in the case that the XRD peak of (200) face of the MgO—AlN solid solution was observed in a range of 42.92° or higher and lower than 43.04°, which was between the peak of cubic crystal of magnesium oxide and the peak of cubic crystal of aluminum nitride, the humidity resistance was good, and in the case that the XRD peak was observed in a range higher than 43.04°, the humidity resistance was further improved.

It was further proved that, as the peak shift of the bulk material was larger and the integration width was smaller, the water resistance of the material was better. That is, according to the Experiment Nos. 1, 2, 7, 8, 10 to 13, 17 and 20 in which the XRD peak shift of (220) face was 0.42° or higher and the integration width was 0.35° or smaller, the surface state was not changed after the water resistance test of the bulk material. According to the Experiment Nos. 3, 9, 14, 15 and 23 to 28, a small number of holes were observed due to elution after water resistance test of bulk materials, and according to Experiment Nos. 4 to 6, 16, 18, 19 and 22 and the Experiment No. 21 in which the integration width was larger than 0.50°, the elution was observed over 40 percent or more of the surface. As can be seen form the results, it was proved that the water resistance of the bulk material was better in the case that dissolved contents of Al and N into MgO were larger and the material was homogenous. That is, in the case that the peak shift of (220) face of the MgO—AlN solid solution from that of magnesium oxide was 0.05° or smaller, elution was observed over 40 percent or more of the surface of the material, indicating that the water resistance was low. In the case that the peak shift was 0.05° or higher and lower than 0.42°, or in the case that the peak shift was 0.42° or higher and the integration width of (200) face of the MgO—AlN solid solution exceeds 0.35°, the water resistance of the material was good. In the case that the peak shift was 0.42° or more and the integration width was 0.35° or less, the water resistance of the material was further improved. That is, in the case that the XRD peak of (220) face of the MgO—AlN solid solution was observed in a range of 62.35° or higher and less than 62.72° (2θ), which was between the peaks of cubic crystal of magnesium oxide and cubic crystal of aluminum nitride, or in the case that the XRD peak of (220) face was 62.72° or more and the integration width of 8200) face exceeds 0.35°, the water resistance of the material was good. In the case that the XRD peak of (220) face was 62.72° or higher and the integration width was 0.35 or less, the water resistance was further improved. Further, in the case that the XRD peak of (200) face of the MgO—AlN solid solution was observed in a range of 42.95° or higher and less than 43.17°, which was between the peaks of cubic crystal of magnesium oxide and cubic crystal of aluminum nitride, the water resistance of the material was good. In the case that 2θ=43.17° or higher, the water resistance was further improved.

Further, based on the results of etching rate, it was proved that the ceramic materials of the Experiment Nos. 1 to 3, 12 and 14 to 16 have high corrosion resistance comparable with that of MgO ceramics of the Experiment No. 5. According to the ceramic materials of the Experiment Nos. 4, 7 to 11, 13 and 21, based on the results of etching rate, although the corrosion resistance was slightly inferior than that of MgO of the Experiment No. 5, the corrosion resistance of the materials was proved to be higher than those of the ceramic material of the Experiment 6 whose main phase was spinel and yttria (etching rate was about 240 nm/h) not shown in the tables. According to the Experiment Nos. 1 to 3 and 7 to 15, the magnesium aluminum oxynitride (Mg—Al—O—N) phase was contained as the sub phase, and as the content of the Mg—Al—N—O phase was larger, the mechanical properties were improved. "A/B" values were shown in tables 2 and 4, provided that "A" was assigned to the XRD peak intensity of 2θ=47 to 49° of the magnesium-aluminum oxynitride phase and "B" was assigned to the XRD peak intensity of (220) face of the MgO—AlN solid solution in 2θ=62.3 to 66.2°. It was meant that, as A/B was larger, the content of the Mg—Al—O—N was larger. As A/B becomes larger, both of the fracture toughness and bending strength were improved. According to the Experiment Nos. 7 to 11, 13, 15, 17, 20 and 21 in which A/B was 0.03 or higher, it was proved that the fracture toughness was 2.5 or higher and the bending strength was as high as 180 MPa or larger. It was further proved that a high bending strength of 200 MPa or larger was observed in the Experiment Nos. 7 to 10, 13, 15, 17, 20 and 21. For example, according to the Experiment No. 8, "A" was 4317 counts, "B" was 83731 counts, A/B was 0.039, the fracture toughness was 2.5 and strength was 222 MPa. Further, according to the Experiment No. 15, "A" was 13566 counts, "B" was 108508 counts, A/B value was 0.125, fracture toughness was 4.4 and strength was 350 MPa. However, as the content of the magnesium-aluminum oxynitride (Mg—Al—N—O) was increased, the content of the MgO—AlN solid solution having higher corrosion resistance was accordingly lowered, so that the corrosion resistance of the material was reduced. For example, according to the Experiment No. 17 in which A/B was 0.3 or higher, the etching rate reached 181 nm/h, and according to the Experiment No. 20 in which A/B exceeds 0.4, the corrosion resistance was proved to be at the same level as that of spinel. As can be seen form the results, it was proved that the corrosion resistance and mechanical strength can be realized at the same time, by making the A/B value in a range of 0.03 or higher and 0.14 or lower. Besides, although the bending strength in the Experiment No. 13 was 188 MPa as a result of the initial measurement, it was proved to be 251 MPa after measuring again for studying the reproducibility. Besides, a/b values were calculated using peak areas "a" and "b" and further shown in tables 2 and 4.

According to the Experiment Nos. 2, 3, 8, 10, 15, 23 and 26, all of the volume resistivities at room temperature were $1\times10^{17}$ Ω·cm or higher and comparable with that of MgO of the Experiment No. 5, and it was thus proved that they were suitable for semiconductor production system applications such as an electrostatic chuck and heater requiring high resistance.

Further, the volume resistivities at 600° C. in the Experiment Nos. 5 and 12 were $2\times10^{12}$ Ω·cm and $1\times10^{10}$ Ω·cm, and it was proved that the ceramic material of the Experiment No. 12 has an electrical resistance lower than that of MgO (Experiment No. 5). Further, it was proved that the ceramic materials according to the Experiment Nos. 1, 3 and 23 to 28 have electrical resistances each lower than that of the Experiment No. 5, as in the Experiment No. 12.

Further, tables 2 and 4 show values of (a+c+d)/(a+b+c+d), provided that "a" was assigned to an area of the XRD peak of 2θ=47 to 49° of the magnesium-aluminum oxynitride phase, that "b" was assigned to an area of the XRD peak of 2θ=62.3 to 65.2° at (220) face of the MgO—AlN solid solution, that "c" was assigned to an area of the XRD peak of 2θ=around 45.0° at (400) face of spinel ($MgAl_2O_4$), and that "d" was assigned to an area of the XRD peak of 2θ=around 36.0° at (002) face of aluminum nitride (AlN). As the value of (a+c+d)/(a+b+c+d) was smaller, the ratio of the MgO—AlN solid solution occupying the ceramic material was larger, and a total of the contents of the magnesium-aluminum oxynitride, spinel (MgAl2O4) and aluminum nitride (AlN), possibly constituting heterogeneous phases, was smaller. According to the Experiment Nos. 1 to 3, 5, 12, 14 and 23 to 28, the value of (a+c+d)/(a+b+c+d) was 0.1 or lower, so that these ceramic materials including a small amount of heterogeneous phases were proved to be suitable for use in a sputtering target member. For example, according to the Experiment No. 14, "a" was 782 counts, "b" was 123644 counts, "c" was 2613 counts and "d" was 0 count, and (a+c+d)/(a+b+c+d) was 0.027, indicating that the contents of the heterogeneous phases were low. Similarly, according to the Experiment No. 23, "a" was 0 count, "b" was 109166 counts, "c" was 0 count and "d" was 2775 counts, and (a+c+d)/(a+b±c+d) was 0.025, indicating that the contents of the heterogeneous phases were low.

As described above, the thus produced ceramic materials maintain crystalline structure of magnesium oxide and have electrical resistances lower than that of magnesium oxide. It was considered that aluminum and nitrogen atoms were dissolved into the magnesium oxide crystals to increase carriers in magnesium oxide. Therefore, in the case that the materials were applied as a sputtering target to produce, for example, a magnetic head of a hard disk and magnetic tunnel junction device such as magnetic resistance random access memory, it is predicted an improvement of property of an electrical resistance and/or magnetic resistance ratio.

(Production and Evaluation of Electrostatic Chuck)

The electrostatic chuck of the type shown in FIG. 6(a) was produced according to the procedure described referring to FIG. 9. It was, however, specifically performed as follows.

(a) Raw materials of MgO, $Al_2O_3$ and AlN were weighed according to mass % shown in the Experiment No. 1 shown in table 1, and wet-mixed using isopropyl alcohol as a solvent, a nylon pot, and alumina agitating media with a diameter of 5 mm for 4 hours. After the mixing, the slurry was collected and dried in nitrogen flow at 110° C. It was then passed through a sieve of 30 mesh to produce formulated powder. Then, the formulated powder was subjected to uniaxial press molding at a pressure of 200 kgf/cm$^2$ to obtain a disk shaped molded body. The molded body was then subjected to hot press sintering to obtain a ceramic sintered body 2A. The hot press sintering was performed at a pressure of 200 kgf/cm$^2$ and at each temperature shown in table 1 under Ar atmosphere until the completion of the sintering. The holding time at the sintering temperature was made 4 hours. Commercial product having an average particle size of 1 μm or smaller was used in the step (a).

(b) The main face 2a of the sintered body 2A was polished so that the surface flatness reaches 10 μm.

(c) Tungsten carbide powder and alumina powder with an average diameter of 0.2 μm were mixed and terpineol was added to prepare paste. The paste was printed on the polished face 2a.

(d) On the main face 2a of the sintered body 2A, alumina powder having an average diameter of 0.2 μm was molded to prepare an alumina molded body 14. It was sintered at 1250 to 1350° C. under argon gas atmosphere while it was uniaxially pressurized. Further, the temperature was elevated until the maximum temperature at an elevation speed of 100° C./hour and held at the maximum temperature for 2 hours. The pressure was made 20 MPa.

(e) The main face 12 of the sintered body 2A was polished to form an adsorption face 1a to obtain a susceptor having a thickness deviation of 100 μm or smaller. A through hole was formed in the central portion of the back face of the plate shaped main body 3 of the thus obtained susceptor to the electrode 4, and a cylindrical terminal 8 was fitted into the through hole, so that a voltage can be applied on the electrodes 4 through the terminal.

Materials forming the dielectric layers (surface corrosion resistant layers) in the Experiment Nos. 1, 2 and 3 shown in table 3 were those used in the Experiments No. 1 in the above examples (table 1).

(Experiment No. 4)

As Experiment No. 4, an electrostatic chuck was produced similarly as the Experiment Nos. 1 to 3, except that the dielectric layer 2 described above was made of the alumina sintered body of the above step (d).

(Test Condition)

Corrosion resistance test: ICP: 800 W, Bias: 450 W, Supplied gas: NF3/O2/Ar=75/35/100 sccm, 0.05 Torr, Exposed time period: 100 hours, Temperature of sample 500° C.

Evaluated properties: Temperature uniformity on a wafer, adsorption force and surface roughness before and after the corrosion resistance test described above were measured.

Measurement of Temperature Uniformity:

An Si wafer was mounted on a mounting face of the electrostatic chuck and a direct current voltage of ±500V was applied onto the electrostatic electrode to adsorb the Si wafer. The vacuum degree in the chamber was set at 1E-4 Torr and power was applied onto the heating resistance to heat to an evaluation temperature of 100° C. at a temperature elevation speed of 10° C./min. After it was confirmed that the input power became constant, the temperature was confirmed by an IR camera (supplied by Nippon Densi: 6100, 21 pts). A difference ΔT between the maximum and minimum values of the temperature on the wafer was defined as temperature uniformity (unit: ° C.). As the temperature uniformity ΔT was smaller, the temperature uniformity was better, enabling more uniform etching in etching treatment of the wafer, for example.

Adsorption Force:

An Si probe (5 cm$^2$) was set on the product and direct current voltage of ±500V was applied onto the electrostatic electrode in vacuum state (1E-4 Torr) to adsorb the Si probe. After 1 minute, the probe was pulled up to measure a force required for the removal. The measurement was performed at four points in a plane; (−40, 40), (−40, −40), (40, −40) and (40, 40). At this time, the center of a circle passing optional three points on the outer profile of the product was made (0, 0).

Surface Roughness:

The roughness of the product surface was measured by Tailor-Hobson roughness measuring instrument. The measurement was performed at two optional positions in inside and outside parts of the plane.

According to the Experiment Nos. 1, 2 and 3, the temperature uniformity on wafer before the corrosion resistance test was relatively good, and deterioration of the temperature uniformity on wafer after the corrosion resistance test was very small and reduction of the adsorption force was very low.

According to the Experiment No. 4, although the initial temperature uniformity on wafer was very good, the temperature uniformity on wafer and adsorption force after the corrosion resistance test were considerably deteriorated.

These actions and effects are epoch-making in the field of semiconductor treating system, and it can be understood that various applications are expected in the industries.

Although specific embodiments of the present invention have been described above, the invention is not to be limited to these specific embodiments and can be performed with various changes and modifications, without departing from claims.

The invention claimed is:

1. An electrostatic chuck comprising a susceptor and an electrostatic chuck electrode embedded within said susceptor, said susceptor comprising an adsorption face of adsorbing a semiconductor:
   wherein said susceptor comprises a plate shaped main body and a surface corrosion resistant layer including said adsorption face;
   wherein said surface corrosion resistant layer comprises a ceramic material comprising magnesium, aluminum, oxygen and nitrogen as main components; and
   wherein said ceramic material comprises, as a main phase, a crystal phase comprising MgO—AlN solid solution wherein aluminum nitride is dissolved into magnesium oxide.

2. The electrostatic chuck of claim 1, wherein a radio frequency voltage is applicable onto said electrostatic chuck electrode.

3. The electrostatic chuck of claim 1, wherein said electrostatic chuck electrode is provided on a main face of said surface corrosion resistant layer on the side of said plate shaped main body.

4. The electrostatic chuck of claim 1, further comprising a heating member embedded within said plate shaped main body.

5. The electrostatic chuck of claim 1, wherein said MgO—AlN solid solution has XRD peaks of (200) and (220) faces taken by using CuKα ray in ranges of 2θ=42.9 to 44.8° and 62.3 to 65.2°, respectively, which are between peaks of cubic crystal of magnesium oxide and cubic crystal of aluminum nitride, respectively.

6. The electrostatic chuck of claim 5, wherein said MgO—AlN solid solution has XRD peaks of (111), (200) and (220) faces taken by using CuKα ray in ranges of 2θ=36.9 to 39°, 2θ=42.9 to 44.8° and 2θ=62.3 to 65.2°, respectively, which are between peaks of cubic crystal of magnesium oxide and cubic crystal of aluminum nitride.

TABLE 5

| Exp. No. | material of dielectric later | temperature uniformity on wafer (° C.) | | | adsorption force (kPa) | | | surface roughness (μm) | | |
|---|---|---|---|---|---|---|---|---|---|---|
| | | before corrosion resistance test | 50RF hours later | 100RF hours later | before corrosion resistance test | 50RF hours later | 100RF hours later | before corrosion resistance test | 50RF hours later | 100RF hours later |
| 1 | Exp. 1 | 2.8 | 2.8 | 2.8 | 18 | 18 | 18 | 0.1 | 0.1 | 0.1 |
| 2 | Exp. 7 | 2.9 | 2.9 | 3.1 | 18 | 17 | 17 | 0.1 | 0.1 | 0.2 |
| 3 | Exp. 5 | 3 | 3 | 3 | 16 | 16 | 15 | 0.1 | 0.1 | 0.1 |
| 4 | alumina | 2.9 | 3.1 | 3.4 | 18 | 16 | 13 | 0.3 | 0.4 | 0.6 |

7. The electrostatic chuck of claim 5, wherein said MgO—AlN solid solution has XRD peaks of (200) and (220) faces in ranges of 2θ=42.92° or higher and 2θ=62.33° or higher, respectively.

8. The electrostatic chuck of claim 5, wherein said MgO—AlN solid solution has XRD peaks of (200) and (220) faces in ranges of 2θ=42.95° or higher and 2θ=62.35° or higher, respectively.

9. The electrostatic chuck of claim 5, wherein said MgO—AlN solid solution has XRD peaks of (200) and (220) faces in ranges of 2θ=43.04° or higher and 2θ=62.50° or higher, respectively.

10. The electrostatic chuck of claim 5, wherein said MgO—AlN solid solution has XRD peaks of (200) and (220) faces in ranges of 2θ=43.17° or higher and 2θ=62.72° or higher, respectively.

11. The electrostatic chuck of claim 1, wherein said MgO—AlN solid solution has an integration width of said XRD peak of (200) face of 0.50° or lower.

12. The electrostatic chuck of claim 1, wherein said ceramic material does not contain AlN crystal phase.

13. The electrostatic chuck of claim 1, wherein said ceramic material comprises a magnesium-aluminum oxynitride phase exhibiting an XRD peak at least in 2θ=47 to 49° taken by using CuKα ray as a sub phase.

14. The electrostatic chuck of claim 13, wherein A/B is 0.03 or higher, provided that A is assigned to a peak intensity of said XRD peak of 2θ=47 to 49° of said magnesium-aluminum oxynitride phase and that B is assigned to a peak intensity of a XRD peak of 2θ=62.3 to 65.2° of (220) face of said MgO—AlN solid solution.

15. The electrostatic chuck of claim 14, wherein A/B is 0.14 or lower.

16. The electrostatic chuck of claim 1, wherein (a+c+d)/(a+b+c+d) is 0.1 or smaller, provided that "a" is assigned to an area of an XRD peak of 2θ=47 to 49° of a magnesium-aluminum oxynitride phase, that "b" is assigned to an area of an XRD peak of 2θ=62.3 to 65.2° of (220) face of said MgO—AlN solid solution, that "c" is assigned to an area of an XRD peak of 2θ=around 45.0° of (400) face of spinel ($MgAl_2O_4$), and that "d" is assigned to an area of an XRD peak of 2θ=around 36.0° of (002) face of aluminum nitride (AlN).

17. The electrostatic chuck of claim 1, wherein said plate shaped main body comprises a ceramics comprising aluminum nitride, yttrium oxide or aluminum oxide as a main phase.

* * * * *